(12) United States Patent
Uchida et al.

(10) Patent No.: US 11,888,008 B2
(45) Date of Patent: *Jan. 30, 2024

(54) SOLID-STATE IMAGING APPARATUS AND ELECTRONIC APPARATUS

(71) Applicant: SONY SEMICONDUCTOR SOLUTIONS CORPORATION, Kanagawa (JP)

(72) Inventors: Tetsuya Uchida, Kanagawa (JP); Ryoji Suzuki, Kanagawa (JP); Hisahiro Ansai, Kanagawa (JP); Yoichi Ueda, Kanagawa (JP); Shinichi Yoshida, Kanagawa (JP); Yukari Takeya, Kanagawa (JP); Tomoyuki Hirano, Kanagawa (JP); Hiroyuki Mori, Kanagawa (JP); Hirotoshi Nomura, Kanagawa (JP); Yoshiharu Kudoh, Kanagawa (JP); Masashi Ohura, Tokyo (JP); Shin Iwabuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/489,427

(22) Filed: Sep. 29, 2021

(65) Prior Publication Data

US 2022/0020799 A1    Jan. 20, 2022

Related U.S. Application Data

(63) Continuation of application No. 16/486,664, filed as application No. PCT/JP2018/006415 on Feb. 22, 2018, now Pat. No. 11,171,167.

(30) Foreign Application Priority Data

Mar. 8, 2017    (JP) .................................. 2017-043810

(51) Int. Cl.
H01L 27/146    (2006.01)

(52) U.S. Cl.
CPC ..... *H01L 27/14623* (2013.01); *H01L 27/1463* (2013.01); *H01L 27/1464* (2013.01); (Continued)

(58) Field of Classification Search
CPC ........... H01L 27/14623; H01L 27/1463; H01L 27/1464; H01L 27/14614
See application file for complete search history.

(56) References Cited

U.S. PATENT DOCUMENTS 6,809,008 B1    10/2004    Holm et al.
11,171,167 B2 *    11/2021    Uchida ............. H01L 27/14614
(Continued)

FOREIGN PATENT DOCUMENTS

CN    101714524    5/2010
JP    2006269546 A    10/2006
(Continued)

OTHER PUBLICATIONS

International Search Report and Written Opinion for International (PCT) Patent Application No. PCT/JP2018/006415, dated May 17, 2018, 13 pages.

(Continued)

*Primary Examiner* — David A Zarneke
(74) *Attorney, Agent, or Firm* — Sheridan Ross PC

(57) ABSTRACT

There is provided a imaging device including: an N-type region formed for each pixel and configured to perform photoelectric conversion; an inter-pixel light-shielding wall penetrating a semiconductor substrate in a depth direction and formed between N-type regions configured to perform the photoelectric conversion, the N-type regions each being formed for each of pixels adjacent to each other; a P-type layer formed between the N-type region configured to (Continued)

perform the photoelectric conversion and the inter-pixel light-shielding wall; and a P-type region adjacent to the P-type layer and formed between the N-type region and an interface on a side of a light incident surface of the semiconductor substrate.

12 Claims, 31 Drawing Sheets

(52) U.S. Cl.
CPC .. *H01L 27/14614* (2013.01); *H01L 27/14627* (2013.01); *H01L 27/14643* (2013.01); *H01L 27/14683* (2013.01)

(56) References Cited

U.S. PATENT DOCUMENTS

| | | | |
|---|---|---|---|
| 11,587,968 B2* | 2/2023 | Ohura | H01L 27/14647 |
| 2010/0084695 A1 | 4/2010 | Park | |
| 2011/0127629 A1 | 6/2011 | Yorikado et al. | |
| 2012/0217602 A1 | 8/2012 | Enomoto | |
| 2013/0015513 A1 | 1/2013 | Kido et al. | |
| 2014/0252420 A1* | 9/2014 | Yi | H01L 27/1463 257/229 |
| 2015/0243700 A1 | 8/2015 | Morooka | |
| 2016/0056198 A1 | 2/2016 | Lee et al. | |
| 2016/0112614 A1 | 4/2016 | Masuda et al. | |
| 2017/0040365 A1 | 2/2017 | Lee et al. | |
| 2018/0012927 A1 | 1/2018 | Kido | |
| 2018/0027157 A1 | 1/2018 | Masuda et al. | |

FOREIGN PATENT DOCUMENTS

| | | |
|---|---|---|
| JP | 2011114325 A | 6/2011 |
| JP | 2012178457 A | 9/2012 |
| JP | 2013041875 A | 2/2013 |
| JP | 2015162603 A | 9/2015 |
| JP | 2016-162917 | 9/2016 |
| JP | 2016-143850 | 1/2018 |
| KR | 20160022456 A | 3/2016 |

OTHER PUBLICATIONS

Official Action (with English translation) for Japanese Patent Application No. 2017-043810, dated Oct. 27, 2020, 12 pages.
Official Action (no English translation available) for Japanese Patent Application No. 2017-043810, dated Feb. 16, 2021, 3 pages.
Official Action for U.S. Appl. No. 16/486,664, dated Mar. 17, 2021, 7 pages. Restriction Requirement.
Notice of Allowance for U.S. Appl. No. 16/486,664, dated Jun. 30, 2021, 7 pages.

* cited by examiner

SOLID-STATE IMAGING APPARATUS AND ELECTRONIC APPARATUS

CROSS REFERENCE TO RELATED APPLICATIONS

This application is a continuation of and claims priority to U.S. patent application Ser. No. 16/486,664, filed Aug. 16, 2019, which is a national stage application under 35 U.S.C. 371 and claims the benefit of PCT Application No. PCT/JP2018/006415 having an international filing date of Feb. 22, 2018, which designated the United States, which PCT application claimed the benefit of Japanese Priority Patent Application No. 2017043810 filed on Mar. 8, 2017, the disclosures of each of which are incorporated herein by reference.

The present technology relates to a solid-state imaging apparatus and an electronic apparatus, and more particularly to a solid-state imaging apparatus and an electronic apparatus in which a P-type solid-phase diffusion layer and an N-type solid-phase diffusion layer are formed on a sidewall of an inter-pixel light-shielding wall formed between pixels such that an intense electric field region is formed to retain electric charge and a saturation charge amount Qs of each pixel is thus increased.

BACKGROUND ART

Traditionally, there is known a technology in which, for the purpose of increasing a saturation charge amount Qs of each pixel of a solid-state imaging apparatus, a P-type diffusion layer and an N-type diffusion layer are formed on a sidewall of a trench formed between pixels for forming an intense electric field region to retain electric charge (e.g., see Patent Literature 1). Hereinafter, this trench will be referred to as an inter-pixel light-shielding wall or a deep trench isolation (DTI).

FIG. 1 is a horizontal cross-sectional view showing an example of the configuration of the solid-state imaging apparatus to which the above-mentioned traditional technology is applied. FIG. 2 is a vertical cross-sectional view equivalent to one pixel of this solid-state imaging apparatus.

This solid-state imaging apparatus is a backside illumination type. A DTI 12 is formed surrounding a photodiode (PD) 11 that is a photoelectric conversion element of each pixel, which is formed inside a Si substrate 10. A P-type solid-phase diffusion layer 13 and an N-type solid-phase diffusion layer 14 are formed between the PD 11 and the DTI 12 in the stated order from the DTI 12 to the PD 11. Specifically, the P-type solid-phase diffusion layer 13 and the N-type solid-phase diffusion layer 14 are formed along the DTI 12, held in contact with a backside Si interface 20 of the Si substrate 10. With this, a PN-junction portion of the P-type solid-phase diffusion layer 13 and the N-type solid-phase diffusion layer 14 is configured to form an intense electric field region to retain electric charge generated in the PD 11.

A light-shielding film 15 is formed on a back side (lower side in the figure) of the DTI 12. The light-shielding film 15 prevents leakage of light to neighboring pixels. The light-shielding film 15 is, for example, made of metal material such as W (tungsten). An on-chip lens (OCL) 16 is formed on a back side of the Si substrate 10. The OCL 16 converges incident light to the PD 11.

A vertical-type transistor trench 17 is opened on a front side (upper side in the figure) of the Si substrate 10. A transfer gate (TG) for reading out electric charge from the PD 11 is formed at the vertical-type transistor trench 17. In addition, a pixel transistor such as an amplifier (AMP) transistor, a select (SEL) transistor, and a reset (RST) transistor is formed on the front side of the Si substrate 10. An element isolation region (hereinafter, referred to as shallow trench isolation (STI)) 21 is formed in an active region (Pwell) 19 between the PD 11 and the pixel transistor. The STI 21 isolates the pixel transistor and the like.

CITATION LIST

Patent Literature

[PTL 1]
Japanese Patent Application Laid-open No. 2015-162603

SUMMARY

Technical Problem

In accordance with the above-mentioned configuration, the P-type solid-phase diffusion layer 13 and the N-type solid-phase diffusion layer 14 which are formed along the DTI 12 form the intense electric field region to be capable of retaining electric charge generated in the PD 11. In the configuration shown in FIG. 2, the N-type solid-phase diffusion layer 14 reaches the backside Si interface 20 of the Si substrate 10, which is a light incident surface side, and pinning of electric charge weakens in this area. Therefore, generated electric charge can flow into the PD 11, which may deteriorate dark characteristics (e.g., white spot appears or dark current is generated).

The present technology has been made in view of the above-mentioned circumstances to be capable of preventing deterioration of the dark characteristics.

In accordance with at least a first embodiment of the present technology, there is provided an imaging device comprising:
 a substrate;
 a plurality of photoelectric conversion elements in the substrate, wherein each of the plurality of photoelectric conversion elements includes an N-type region that performs photoelectric conversion;
 a light shielding wall between a first photoelectric conversion element and a second photoelectric conversion element of the plurality of photoelectric conversion elements in the substrate;
 a first P-type region between the first photoelectric conversion region and the light shielding wall; and
 a second P-type region adjacent to the first P-type region and between the first photoelectric conversion region and a light incident side interface of the substrate.

In accordance with another embodiment of the present technology, there is provided an electronic apparatus comprising:
 an imaging device, including:
  a substrate;
  a plurality of photoelectric conversion elements in the substrate,
   wherein each of the plurality of photoelectric conversion elements includes an N-type region that performs photoelectric conversion;
  a light shielding wall between a first photoelectric conversion element and a second photoelectric conversion element of the plurality of photoelectric conversion elements in the substrate;

a first P-type region between the first photoelectric conversion region and the light shielding wall; and a second P-type region adjacent to the first P-type region and between the first photoelectric conversion region and a light incident side interface of the substrate.

Advantageous Effects of Invention

In accordance with the first and second embodiments of the present technology, deterioration of dark characteristics can be prevented.

DESCRIPTION OF EMBODIMENTS

Hereinafter, best modes (hereinafter, referred to as embodiments) for carrying out the present technology will be described in detail with reference to the drawings.

First Embodiment

Figure 1:
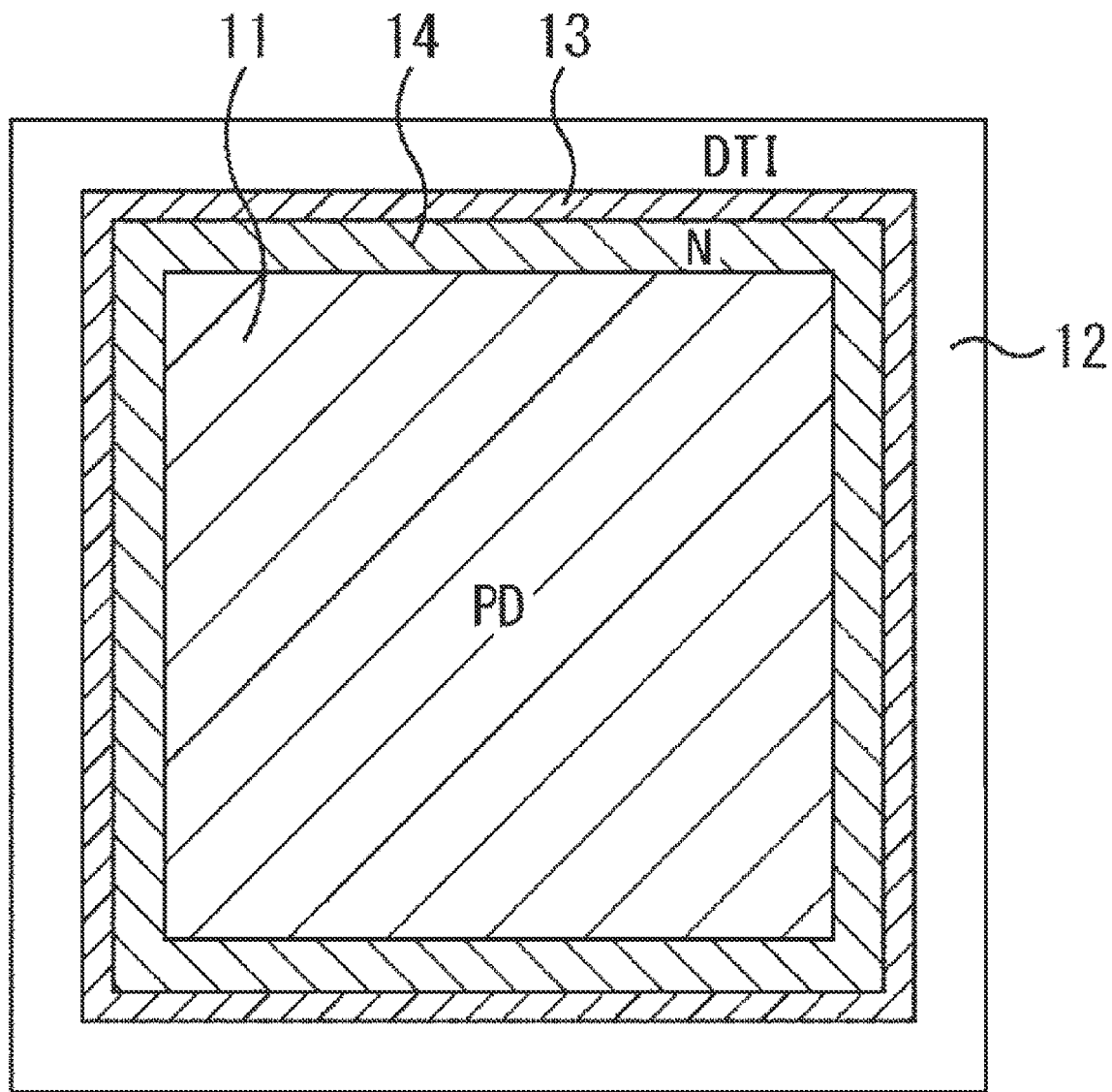
FIG. 1 is a horizontal cross-sectional view showing an example of a configuration of a solid-state imaging apparatus to which a traditional technology is applied.
Figure 2:
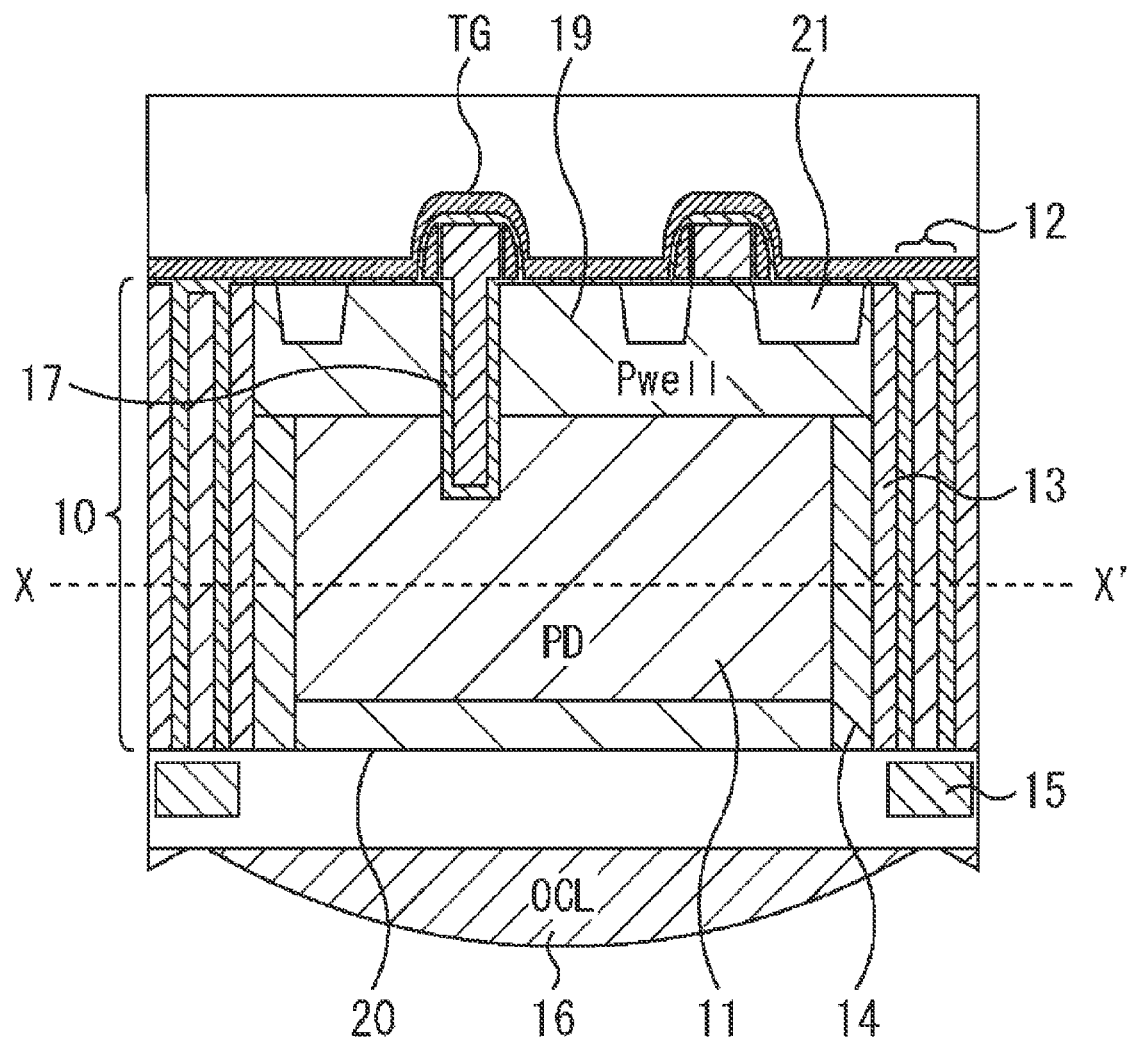
FIG. 2 is a vertical cross-sectional view showing the example of the configuration of the solid-state imaging apparatus to which the traditional technology is applied.
Figure 3:
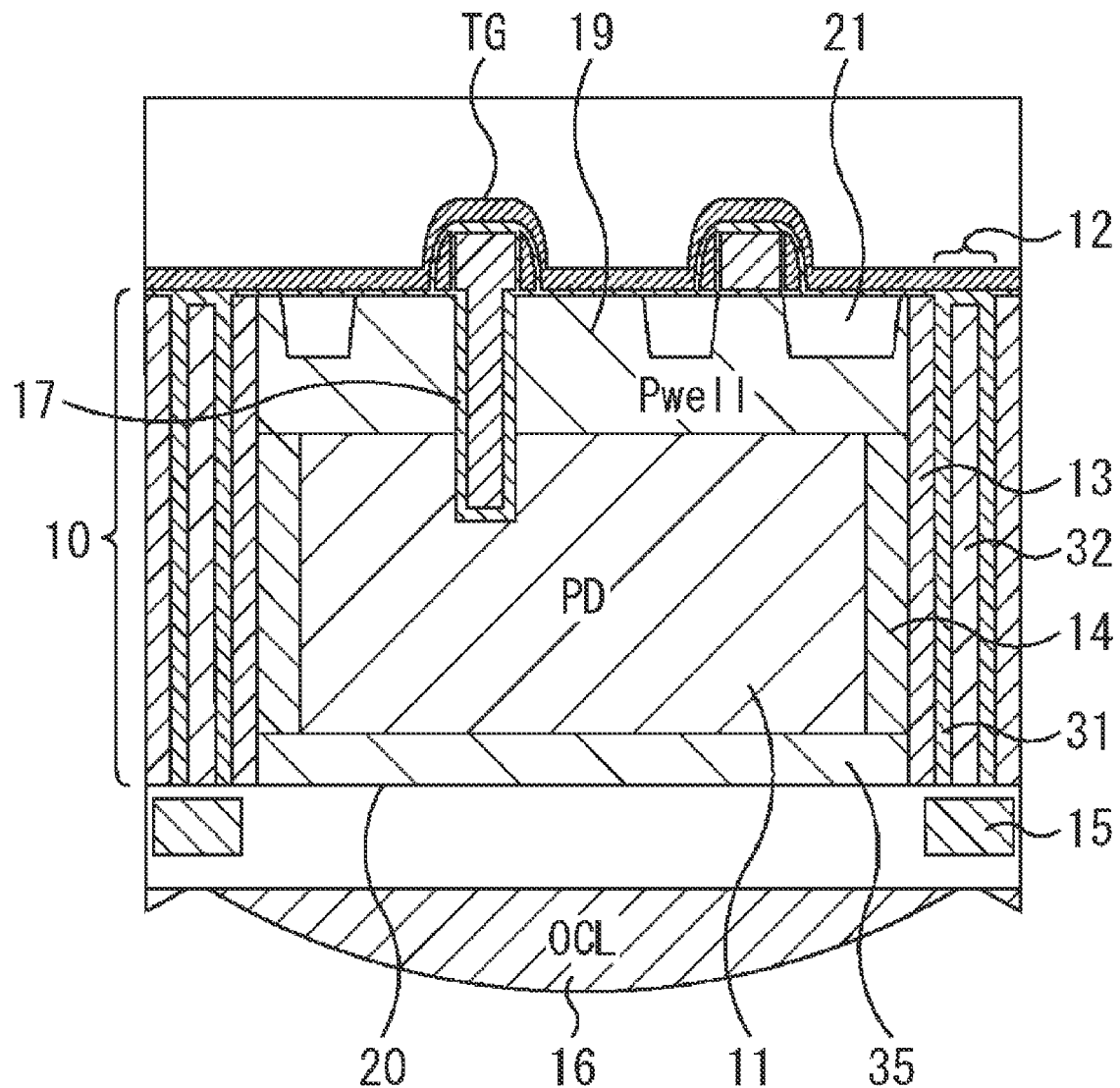
FIG. 3 is a vertical cross-sectional view showing a first configuration example of a solid-state imaging apparatus to which the present technology is applied.
Figure 4:
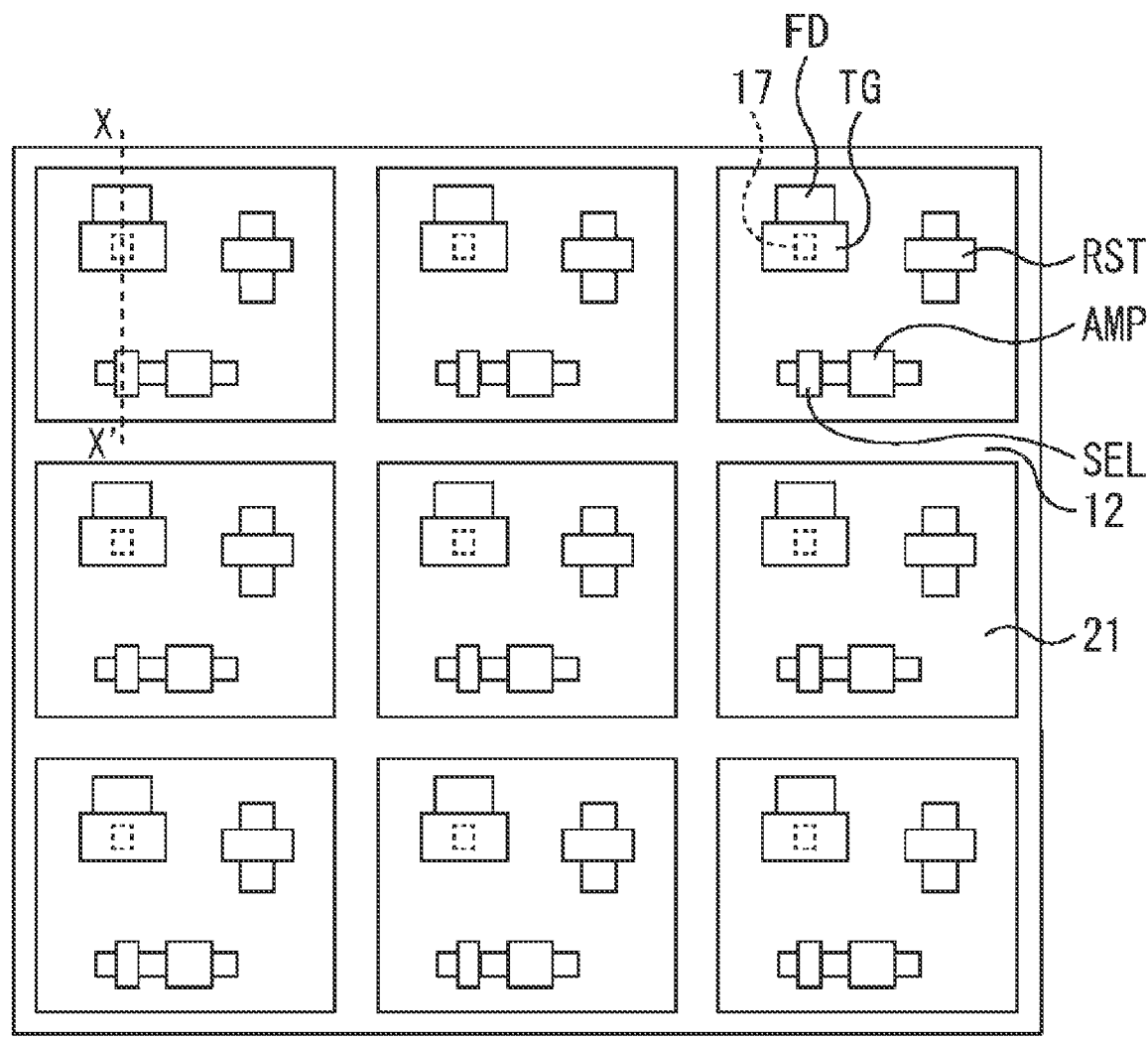
FIG. 4 is a plan view on a front side of the first configuration example of the solid-state imaging apparatus to which the present technology is applied.

FIG. 3 is a vertical cross-sectional view showing a first configuration example (first embodiment) of the solid-state imaging apparatus to which the present technology is applied. FIG. 4 is a plan view on a front side of the first embodiment. Note that FIG. 3 corresponds to the position of the line X-X' of FIG. 4. Components common to those of embodiments to be described below and the example of the traditional configuration shown in FIG. 2 are denoted by identical signs, and descriptions thereof will be appropriately omitted.

The first embodiment is a backside-illumination type. The DTI 12 is formed penetrating the Si substrate 10 while surrounding a region of each pixel. The P-type solid-phase diffusion layer 13 and the N-type solid-phase diffusion layer 14 are formed between the PD 11 and the DTI 12 in the stated order from the DTI 12 to the PD 11.

Note that the solid-phase diffusion layer refers to a layer generated in accordance with a manufacturing method to be described later, though not limited thereto in the present technology. The P-type layer and the N-type layer generated in accordance with another manufacturing method may be each provided between the DTI 12 and the PD 11. Further, the PD 11 in the embodiment includes N-type regions. Photoelectric conversion is performed on some or all of those N-type regions.

In addition, a sidewall film 31 made of SiO2 is formed on an inner wall of the DTI 12. A filler 32 made of polysilicon is embedded inside the sidewall film 31.

It should be noted that the P-type solid-phase diffusion layer 13 is formed in contact with the light incident side or backside Si interface 20 while the N-type solid-phase diffusion layer 14 is not in contact with the backside Si interface 20 and a space is provided between the N-type solid-phase diffusion layer 14 and the backside Si interface 20.

In this manner, in the first embodiment, a P-type region 35 is provided between the PD 11 and the backside Si interface 20, and the P-type region 35 is provided between the N-type solid-phase diffusion layer 14 and the backside Si interface 20. In other words, the P-type region 35 is provided in a region of the Si substrate 10 in which the PD 11 and the like are not formed. The PD 11 and the N-type solid-phase diffusion layer 14 are not present near the backside Si interface 20. With this, weakening of pinning near the backside Si interface 20 does not occur. Thus, it is possible to prevent generated electric charge from flowing into the PD 11, which deteriorates dark characteristics.

Note that, regarding the DTI 12, SiN may be used for the sidewall film 31 instead of $SiO_2$. Further, doping polysilicon may be used for the filler 32 instead of polysilicon. If the inside of the sidewall film 31 is filled with doping polysilicon or if the inside of the sidewall film 31 is filled with polysilicon and then doped with N-type impurities or P-type impurities, application of a negative bias thereon can strengthen pinning of the sidewall of the DTI 12. Thus, it is possible to further improve the dark characteristics.

Figure 5:
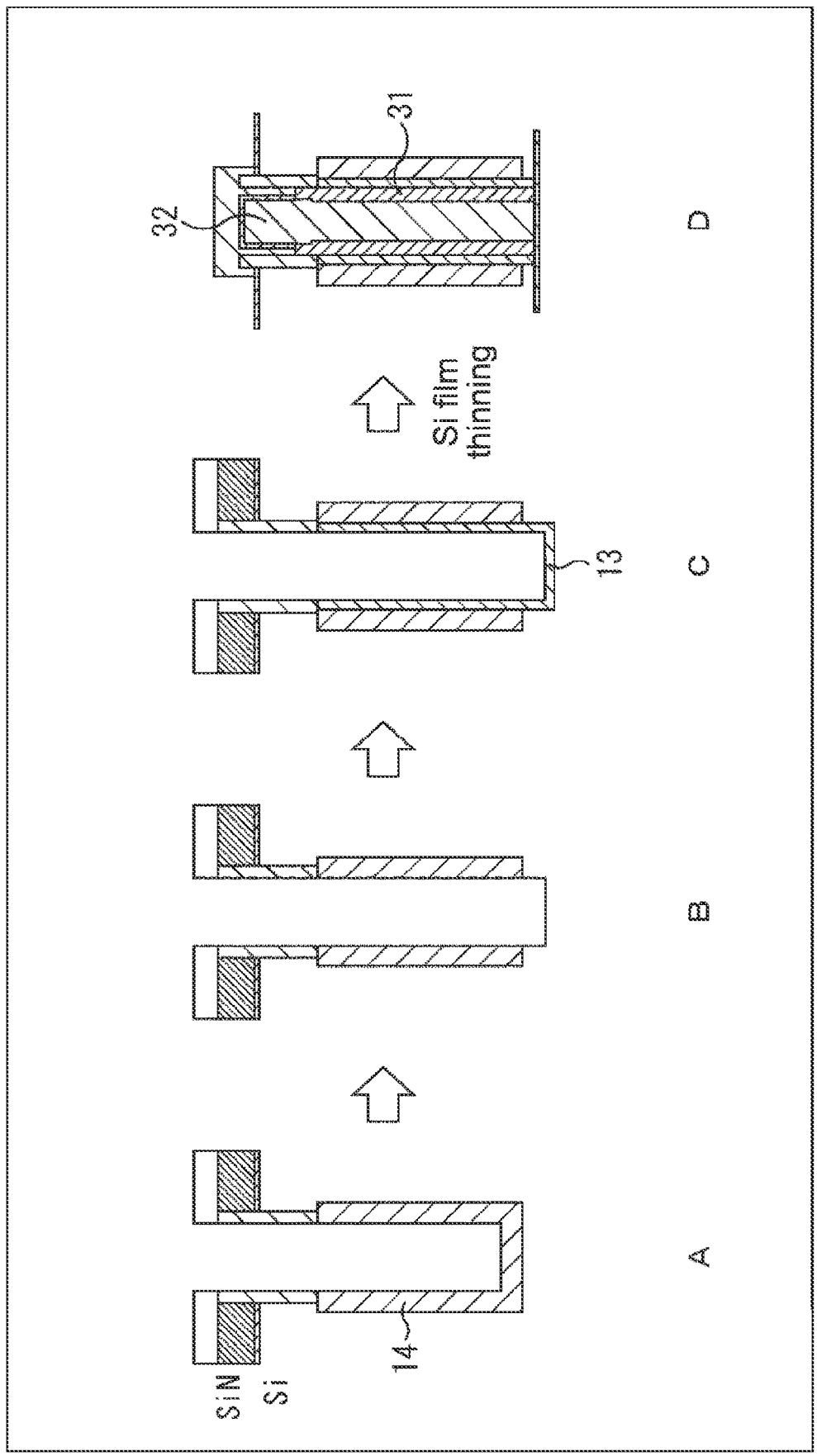
FIG. 5 is a diagram for describing a manufacturing method for a DTI 12 and peripheries thereof which is associated with features of the present technology.

Manufacturing Method for DTI 12 and Peripheries Thereof Which is Associated with Features of Present Technology FIG. 5 is a diagram for describing a manufacturing method for the DTI 12 and peripheries thereof which is associated with features of the present technology.

For opening the DTI 12 in the Si substrate 10, a portion of the Si substrate 10 other than a position at which the DTI 12 is to be formed is covered with a hard mask using SiN and $SiO_2$ as shown in A of FIG. 5. Then, a portion not covered with the hard mask is dry-etched. Thus, a groove is opened vertically extending to a predetermined depth of the Si substrate 10.

Next, the SiO2 film containing P (phosphorus) that is N-type impurities is deposited inside the opened groove. Then, heat treatment is performed. Doping with P from the SiO2 film to the Si substrate 10 (hereinafter, referred to as solid-phase diffusion) is achieved.

Next, as shown in B of FIG. 5, the SiO2 film containing P, which is deposited inside the opened groove, is removed. Then, heat treatment is performed again. P is diffused into the Si substrate 10. In this manner, the N-type solid-phase diffusion layer 14 self-aligned with the shape of the current groove is formed. After that, a bottom portion of the groove is etched by dry etching and the groove is extended in a depth direction.

Next, as shown in C of FIG. 5, a $SiO_2$ film containing B (boron) that is P-type impurities is deposited inside the extended groove. Then, heat treatment is performed. Solid-phase diffusion of B from the $SiO_2$ film to the Si substrate 10 is performed. In this manner, the P-type solid-phase diffusion layer 13 self-aligned with the shape of the extended groove is formed.

After that, the $SiO_2$ film containing B, which is deposited on an inner wall of the groove, is removed.

Finally, as shown in D of FIG. 5, a sidewall film 31 made of $SiO_2$ is deposited on the inner wall of the opened groove, the inside is filled with polysilicon, and the DTI 12 is formed. Then, a pixel transistor and a wire are formed. After that, the Si substrate 10 is thinned from the back side. At that time, the bottom portion of the DTI 12 and the P-type solid-phase diffusion layer 13 are simultaneously thinned.

This film thinning is performed up to a depth not to reach the N-type solid-phase diffusion layer 14.

Through the above-mentioned processes, an intense electric field region can be formed adjacent to the PD 11 by the N-type solid-phase diffusion layer 14 which is not in contact with the backside Si interface 20 and the P-type solid-phase diffusion layer 13 which is in contact with the backside Si interface 20.

Second Embodiment

Figure 6:
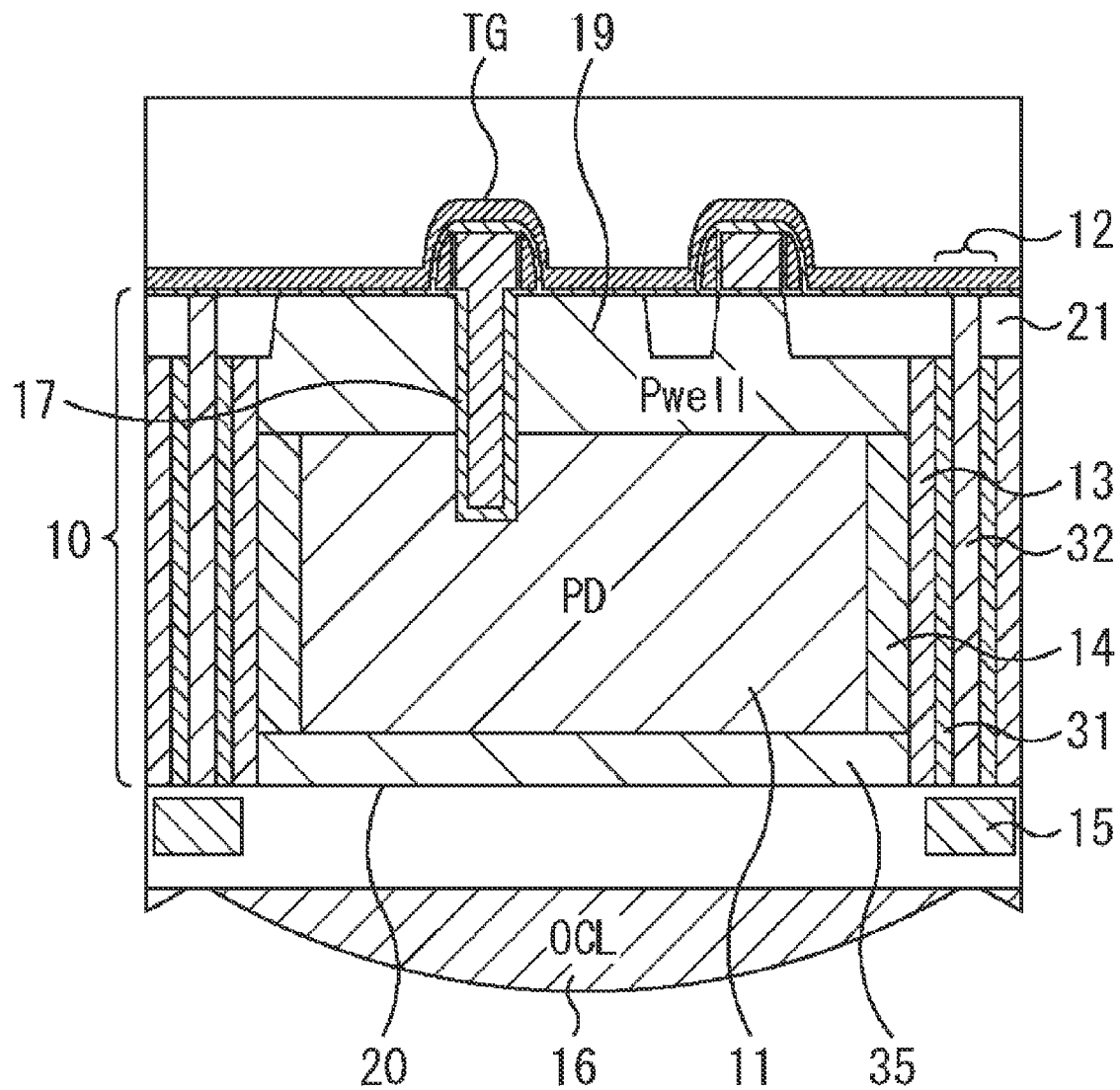
FIG. 6 is a vertical cross-sectional view showing a second configuration example of the solid-state imaging apparatus to which the present technology is applied.

FIG. 6 is a vertical cross-sectional view showing a second configuration example (second embodiment) of the solid-state imaging apparatus to which the present technology is applied.

The second embodiment is different in that the DTI 12 is formed in the STI 21, from the first embodiment (the DTI 12 is formed in the active region 19). Other configurations are similar to those of the first embodiment.

The second embodiment can also obtain effects similar to those of the first embodiment.

Third Embodiment

Figure 7:
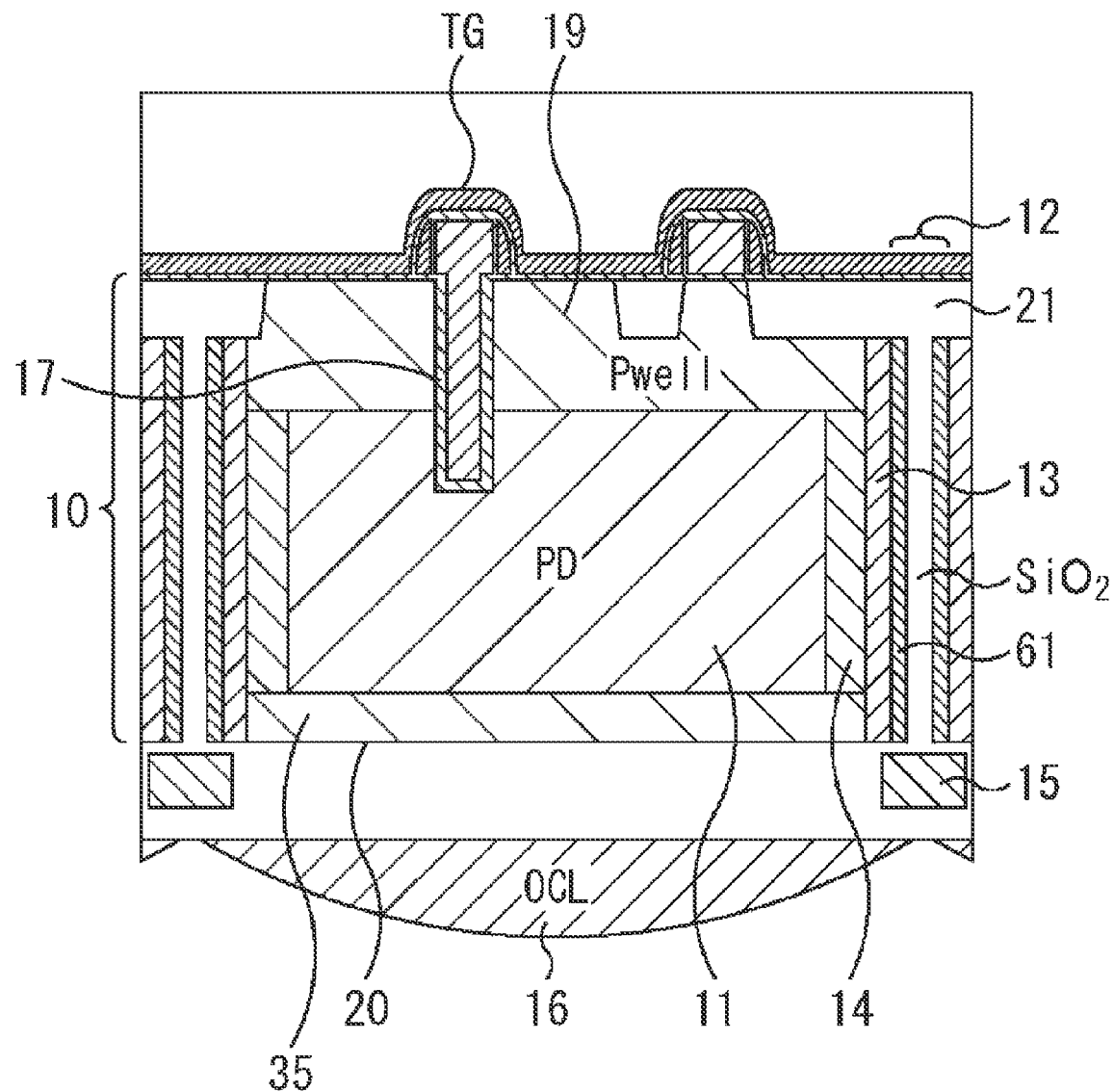
FIG. 7 is a vertical cross-sectional view showing a third configuration example of the solid-state imaging apparatus to which the present technology is applied.

FIG. 7 is a vertical cross-sectional view showing a third configuration example (third embodiment) of the solid-state imaging apparatus to which the present technology is applied.

The third embodiment is different in that a film 61 having negative fixed electric charge is formed on the sidewall of the DTI 12 and the inside is filled with SiO2, from the second embodiment (the sidewall film 31 of SiO2 is formed on the sidewall of the DTI 12 and the inside is filled with polysilicon). Other configurations are similar to those of the second embodiment. Note that an HfO film, a TaO film, an AlO film, and the like can be used as the film 61 formed on the sidewall of the DTI 12.

In the third embodiment, pinning of the trench sidewall of the DTI 12 is strengthened. Thus, the dark characteristics can be further improved in comparison with the second embodiment.

For forming the DTI 12 in the third embodiment, after the back side is ground in the state shown in D of FIG. 5 until the filler 32 made of polysilicon is exposed, it is only necessary to remove the filler 32 and the sidewall film 31 (SiO2) inside the groove by photoresist and wet etching, deposit the film 61, and then fill the groove with SiO2.

Note that the inside of the groove may be filled with metal material such as W instead of $SiO_2$ as the filler. In this case, light transmission of oblique incident light in the DTI 12 is suppressed, and hence color mixing can be improved.

Fourth Embodiment

Figure 8:
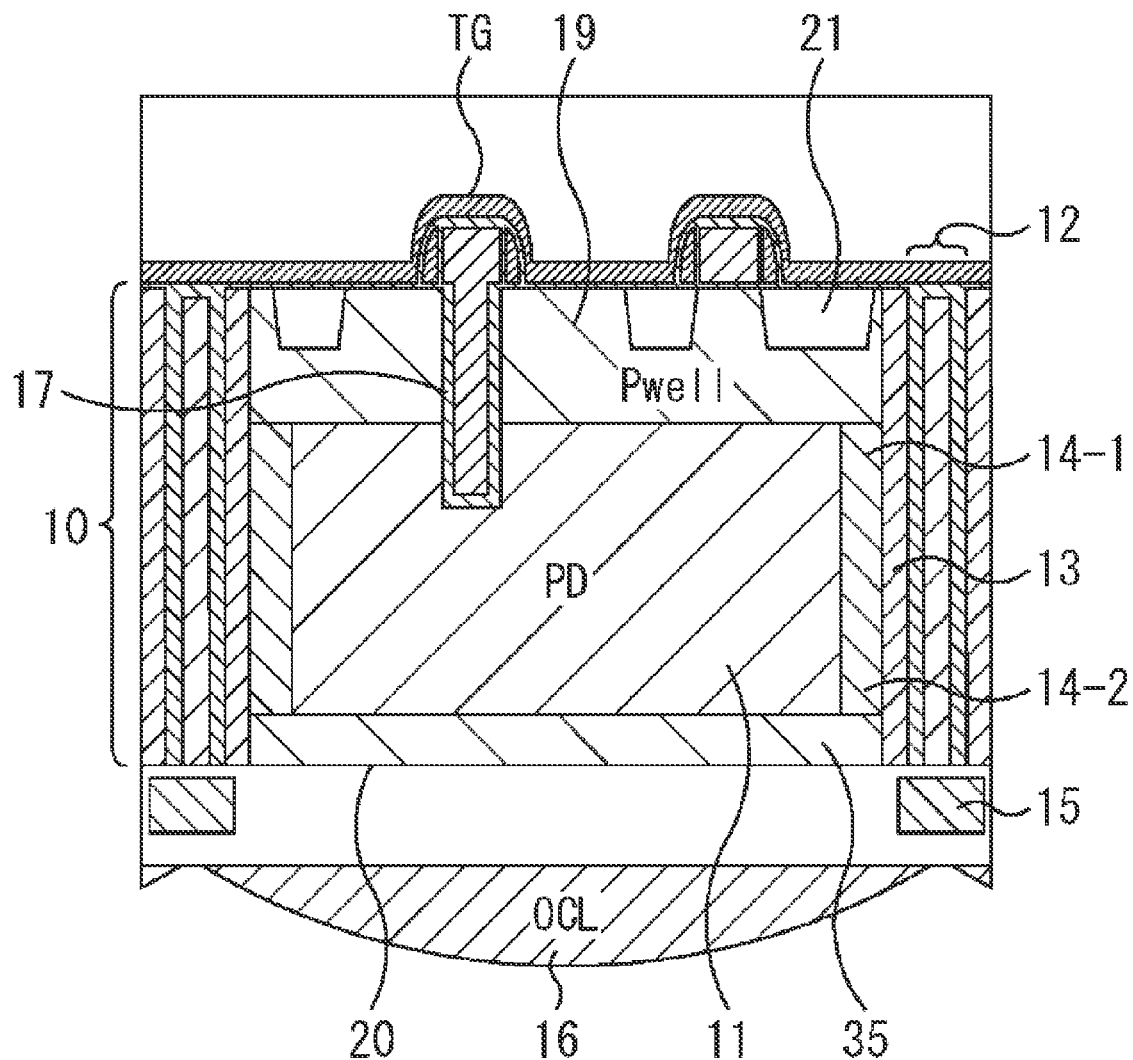
FIG. 8 is a vertical cross-sectional view showing a fourth configuration example of the solid-state imaging apparatus to which the present technology is applied.

FIG. 8 is a vertical cross-sectional view showing a fourth configuration example (fourth embodiment) of the solid-state imaging apparatus to which the present technology is applied.

The fourth embodiment is different in that the N-type solid-phase diffusion layer 14 formed along the DTI 12 has a concentration gradient in the depth direction of the Si substrate 10, from the first embodiment (the N-type solid-phase diffusion layer 14 has constant concentration in the depth direction). Other configurations are similar to those of the first embodiment.

That is, an N-type solid-phase diffusion layer 14-1 closer to the front side is formed such that the concentration of the N-type impurities is higher while an N-type solid-phase diffusion layer 14-2 closer to the back side is formed such that the concentration of the N-type impurities is lower.

The fourth embodiment can obtain effects similar to those of the first embodiment and can also facilitate reading out of electric charge because potential on the back side becomes smaller by providing the concentration gradient to the N-type solid-phase diffusion layer 14.

For providing the concentration gradient to the N-type solid-phase diffusion layer 14, etching damage is given to the sidewall of the groove when the groove of the DTI 12 is formed, for example, and a difference in solid-phase diffusion doping amount due to an amount of such damage can be utilized.

Note that, instead of providing the concentration gradient to the N-type solid-phase diffusion layer 14, the P-type solid-phase diffusion layer 13 closer to the front side may be formed such that the concentration of the P-type impurities is lower while the P-type solid-phase diffusion layer 13 closer to the back side may be formed such that the concentration of the P-type impurities is higher. Also in this case, effects similar to those in the case of providing the concentration gradient to the N-type solid-phase diffusion layer 14 can be obtained.

Alternatively, the concentration gradient may be provided to both of the N-type solid-phase diffusion layer 14 and the P-type solid-phase diffusion layer 13.

Fifth Embodiment

Figure 9:
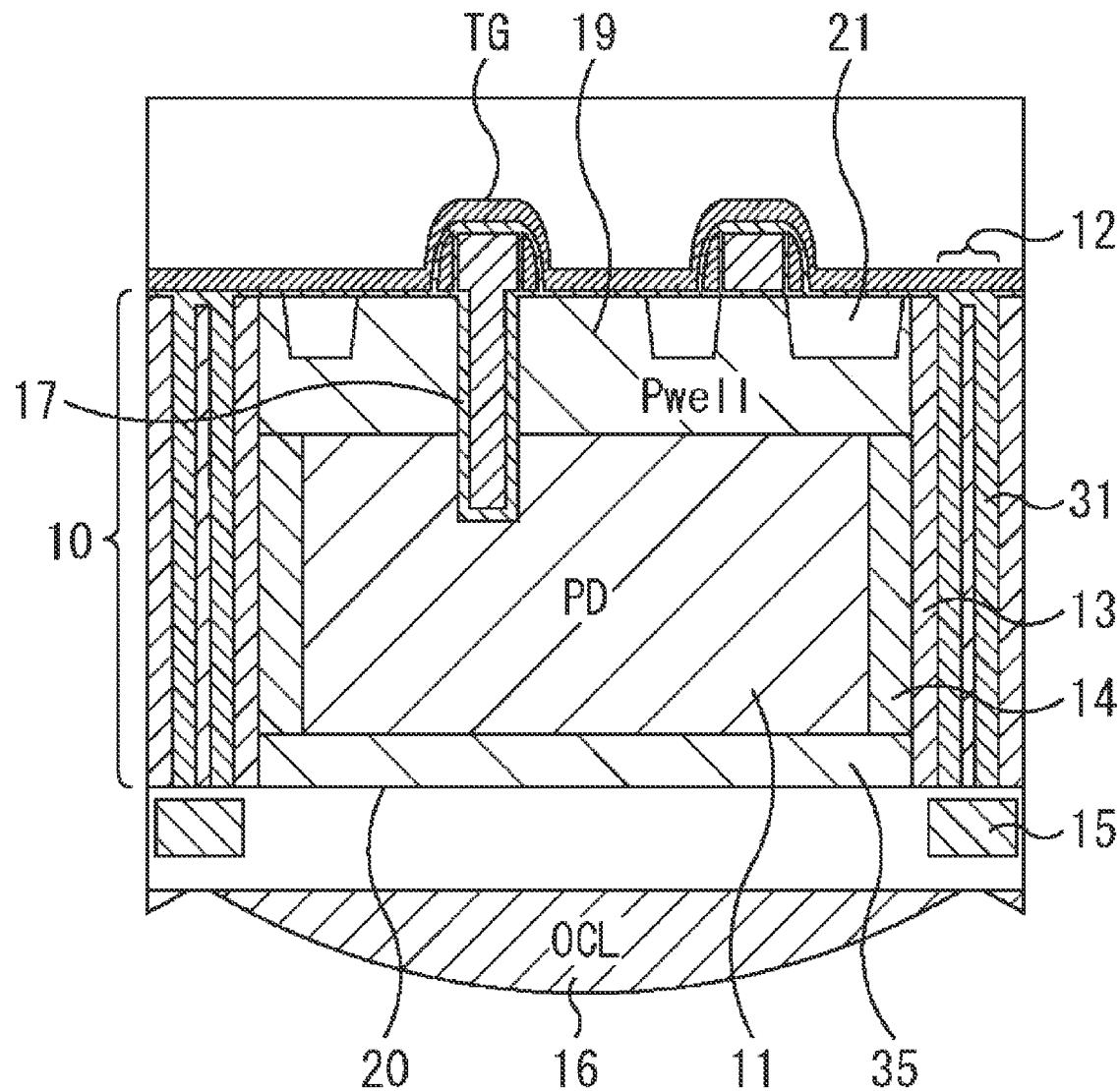
FIG. 9 is a vertical cross-sectional view showing a fifth configuration example of the solid-state imaging apparatus to which the present technology is applied.

FIG. 9 is a vertical cross-sectional view showing a fifth configuration example (fifth embodiment) of the solid-state imaging apparatus to which the present technology is applied.

The fifth embodiment is the first embodiment in that the sidewall film 31 made of $SiO_2$, which is formed on the inner wall of the DTI 12, is thicker than that of the first embodiment. Other configurations are similar to those of the first embodiment.

$SiO_2$ is lower in light refractive index than Si. Thus, incident light entering the Si substrate 10 is reflected in accordance with Snell's law and light transmission to neighboring pixels is suppressed. However, if the sidewall film 31 is thin, the Snell's law is not completely established and transmitted light increases. In the fifth embodiment, the thick sidewall film 31 is formed. Thus, deviation from the Snell's law is prevented, reflection of incident light on the sidewall film 31 increases, and transmission to neighboring pixels can be suppressed. Thus, the fifth embodiment can obtain effects similar to those of the first embodiment and can also prevent color mixing to neighboring pixels which is caused by oblique incident light.

Sixth Embodiment

Figure 10:
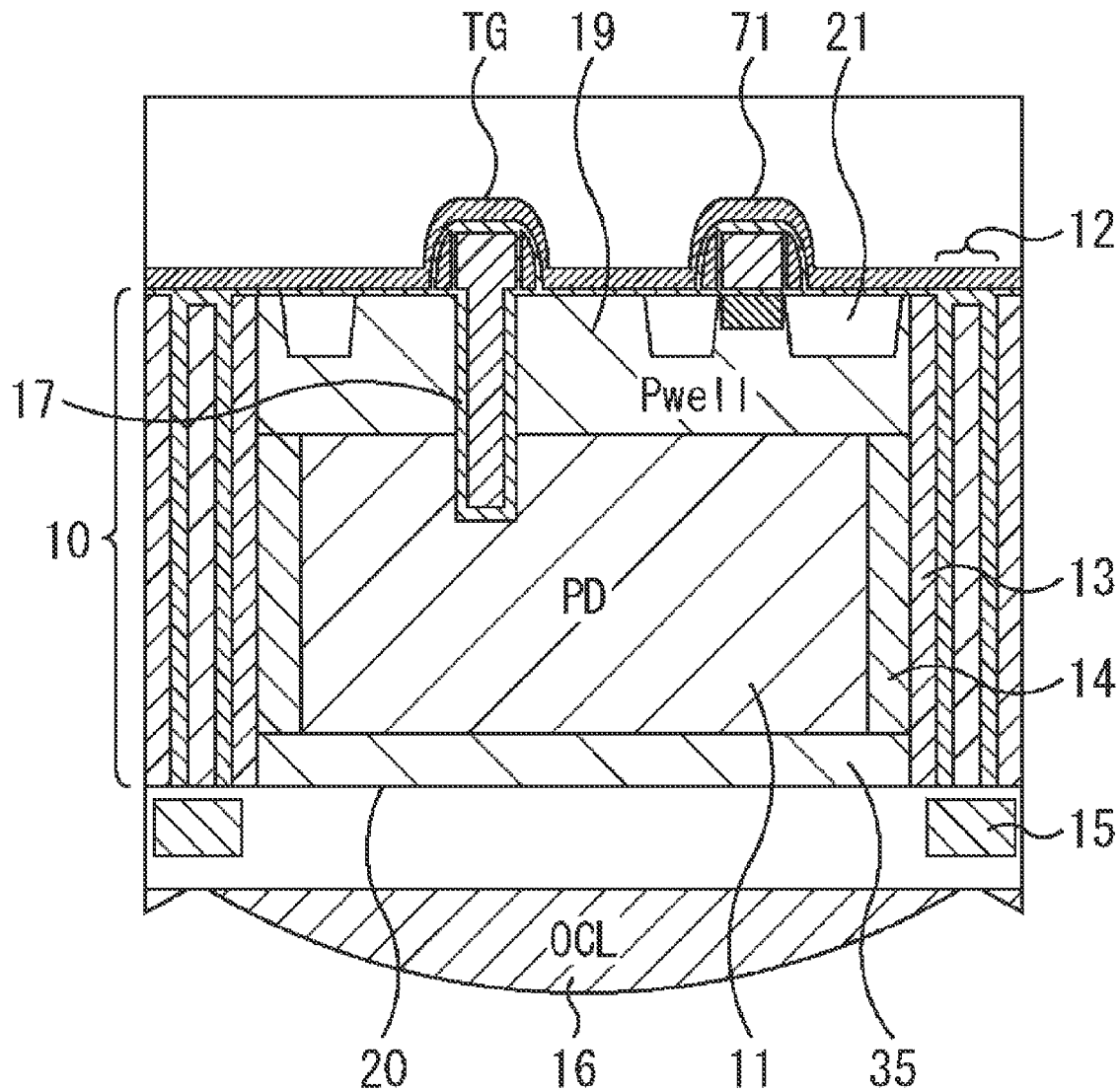
FIG. 10 is a vertical cross-sectional view showing a sixth configuration example of the solid-state imaging apparatus to which the present technology is applied.

FIG. 10 is a vertical cross-sectional view showing a sixth configuration example (sixth embodiment) of the solid-state imaging apparatus to which the present technology is applied.

The sixth embodiment is different in that an MOS capacitor 71 and a pixel transistor (not shown) are formed on the front side of the Si substrate 10, from the first embodiment (the MOS capacitor 71 is not formed on the front side of the Si substrate 10). Other configurations are similar to those of the first embodiment.

Typically, even if the saturation charge amount Qs of the PD 11 is increased, the output is limited due to an amplitude limit of a vertical signal line VSL unless conversion efficiency is lowered. Thus, it is difficult to completely utilize the increased saturation charge amount Qs. In order to lower the conversion efficiency of the PD 11, it is necessary to add capacity to a floating diffusion (FD). In the sixth embodiment, the MOS capacitor 71 corresponds to the capacity added to the FD.

The sixth embodiment can obtain effects similar to those of the first embodiment and can also completely utilize the increased saturation charge amount Qs because the conversion efficiency of the PD 11 can be lowered by adding the MOS capacitor 71 to the FD.

Seventh Embodiment

Figure 11:
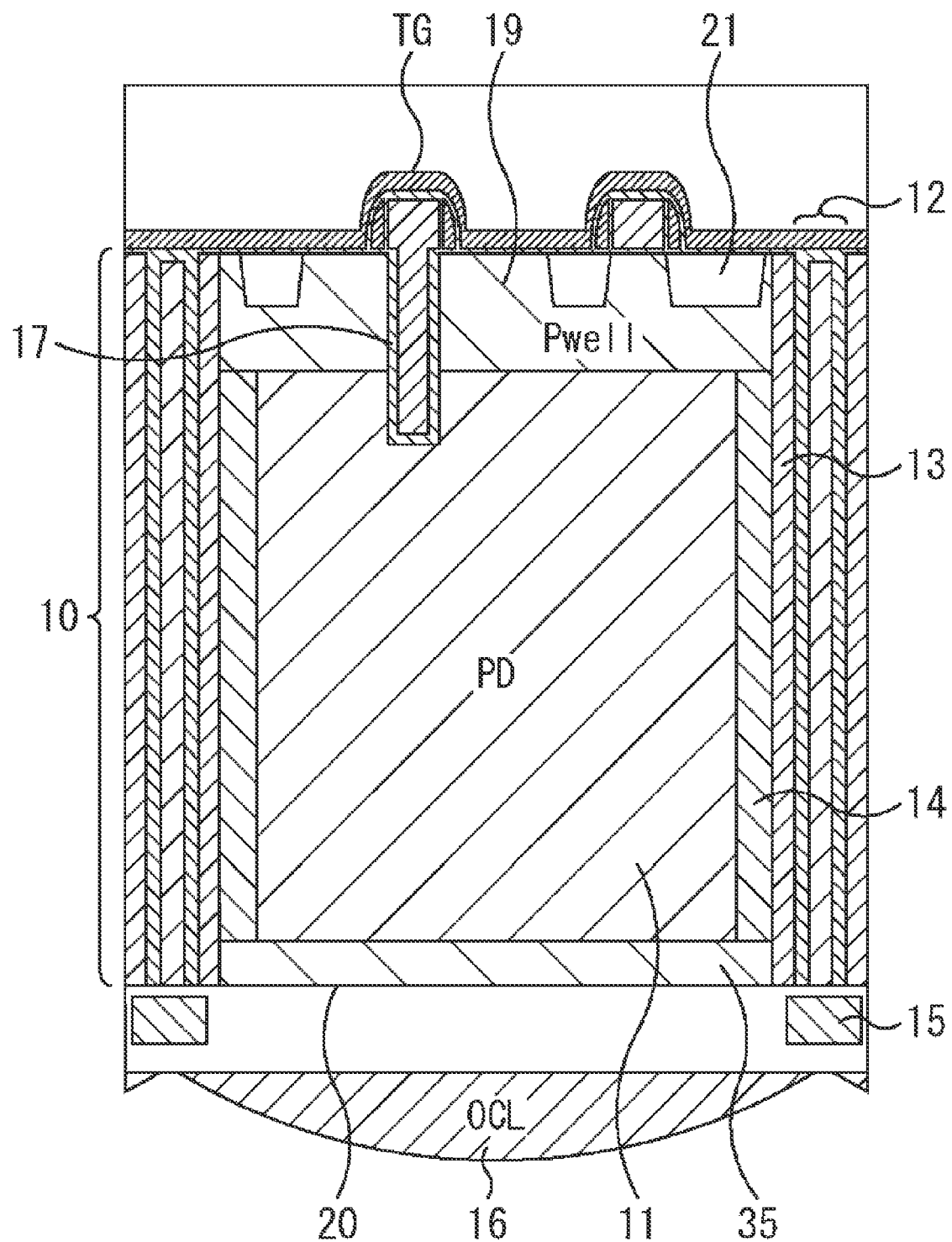
FIG. 11 is a vertical cross-sectional view showing a seventh configuration example of the solid-state imaging apparatus to which the present technology is applied.

FIG. 11 is a vertical cross-sectional view showing a seventh configuration example (seventh embodiment) of the solid-state imaging apparatus to which the present technology is applied.

In the seventh embodiment, the Si substrate 10 is thicker in comparison with the first embodiment. Other configurations are similar to those of the first embodiment.

Along with an increase in thickness of the Si substrate 10, the area of the PD 11 increases, the depth of the DTI 12 increases, and the area of the PN-junction portion of the P-type solid-phase diffusion layer 13 and the N-type solid-phase diffusion layer 14 increases.

Thus, the seventh embodiment can obtain effects similar to those of the first embodiment and can also further increase the saturation charge amount Qs in comparison with the first embodiment.

Eighth Embodiment

Figure 12:
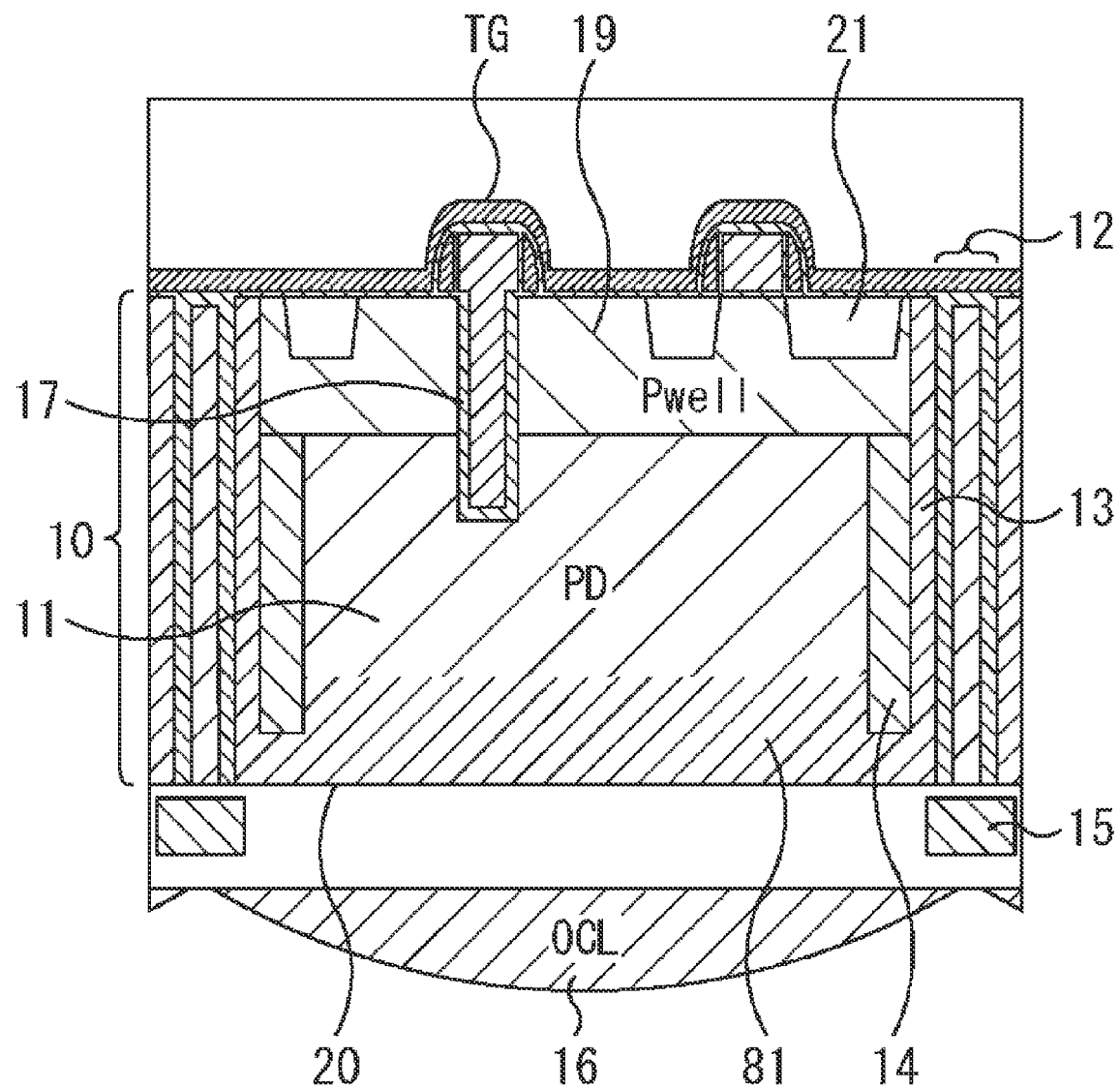
FIG. 12 is a vertical cross-sectional view showing an eighth configuration example of the solid-state imaging apparatus to which the present technology is applied.

FIG. 12 is a vertical cross-sectional view showing an eighth configuration example (eighth embodiment) of the solid-state imaging apparatus to which the present technology is applied.

The eighth embodiment is different in that, by doping a region 81 between the PD 11 and the backside Si interface 20 with the P-type impurities, the concentration gradient is provided such that the concentration of the P-type impurities in the Si substrate 10 is higher on the back side than the front side, from the first embodiment (the Si substrate 10 does not have the concentration gradient). Other configurations are similar to those of the first embodiment.

Thus, the eighth embodiment can obtain effects similar to those of the first embodiment and can also facilitate reading out of electric charge in comparison with the first embodiment.

Ninth Embodiment

Figure 13:
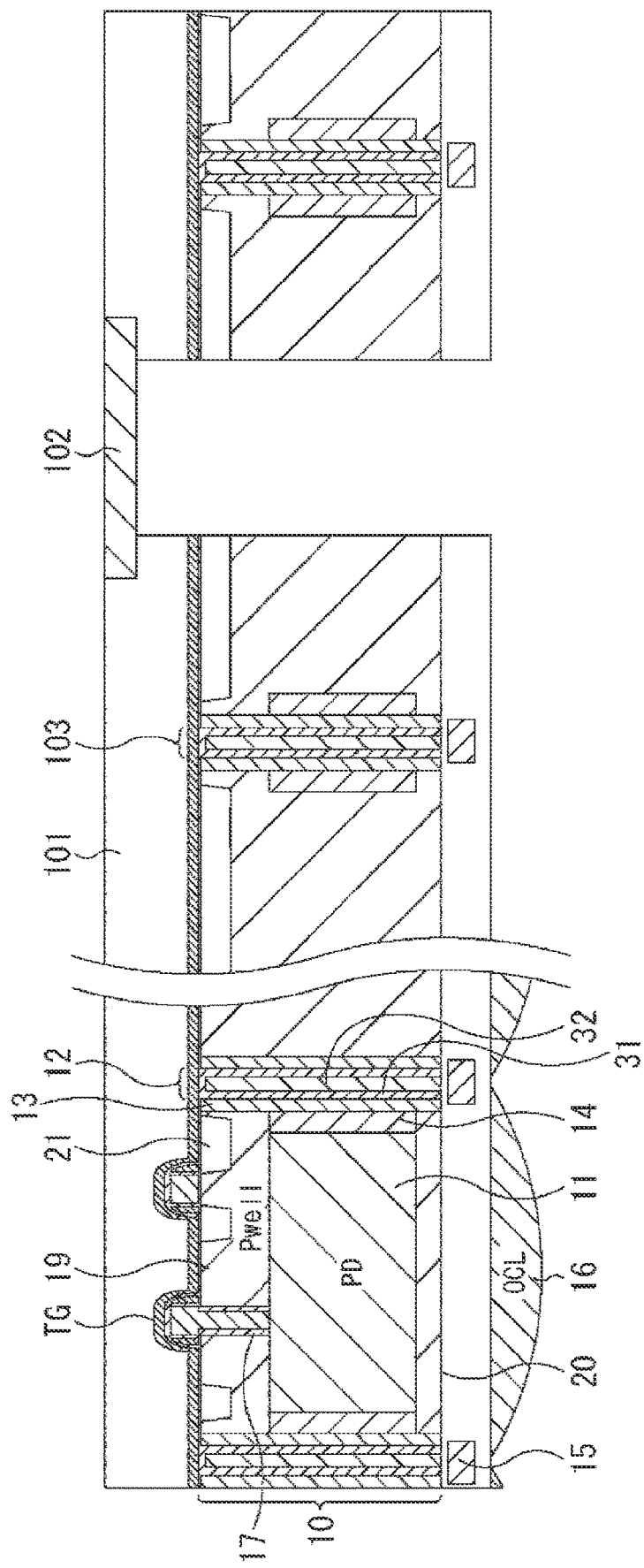
FIG. 13 is a vertical cross-sectional view showing a ninth configuration example of the solid-state imaging apparatus to which the present technology is applied.
Figure 14:
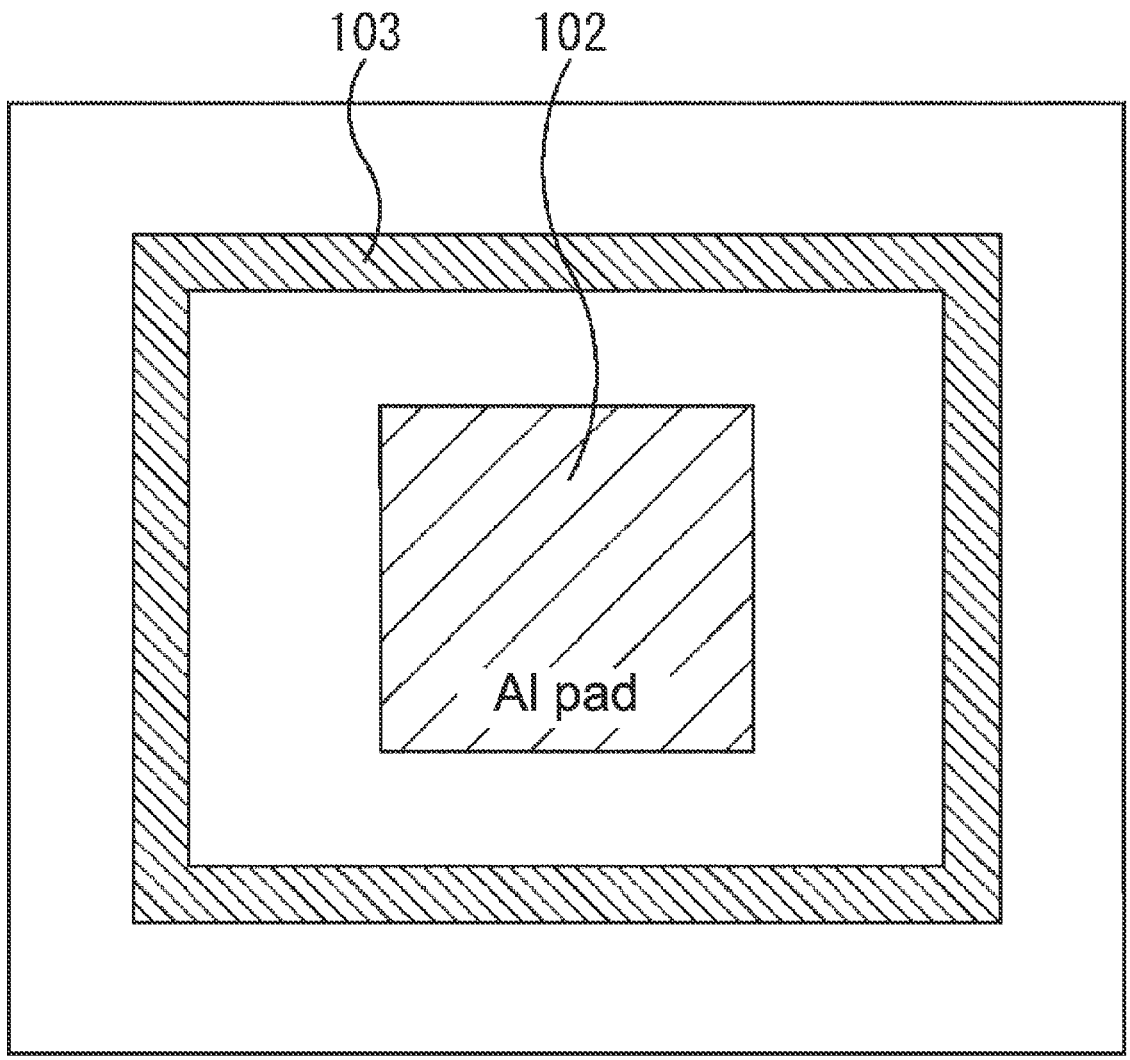
FIG. 14 is a plan view corresponding to the ninth configuration example shown in FIG. 13.

FIG. 13 is a vertical cross-sectional view showing a ninth configuration example (ninth embodiment) of the solid-state imaging apparatus to which the present technology is applied. FIG. 14 is a plan view of an Al-pad extraction portion of the ninth embodiment.

The ninth embodiment includes a pixel array portion (left side in figure) configured in a manner similar to that of the first embodiment and an Al-pad extraction portion 101. Regarding the Al-pad extraction portion 101, Al pads 102 that are connection terminals between the solid-state imaging apparatus and other semiconductor substrates and the like are formed in a substrate surface (upper side in figure).

As shown in FIG. 14, a solid-phase diffusion trench 103 is formed around each Al pad 102 in the Al-pad extraction portion 101. The solid-phase diffusion trench 103 is formed in a manner similar to the DTI 12 of the first embodiment. With this, it is possible to electrically isolate each Al pad 102 from the pixel array portion and other peripheral circuit portions (not shown).

Note that the solid-phase diffusion trench 103 formed in the Al-pad extraction portion 101 can be utilized as a mark for photoresist, for example. Moreover, with this, the solid-phase diffusion trench 103 can also be used as an alignment mark for the subsequent processes.

Tenth Embodiment

Figure 15:
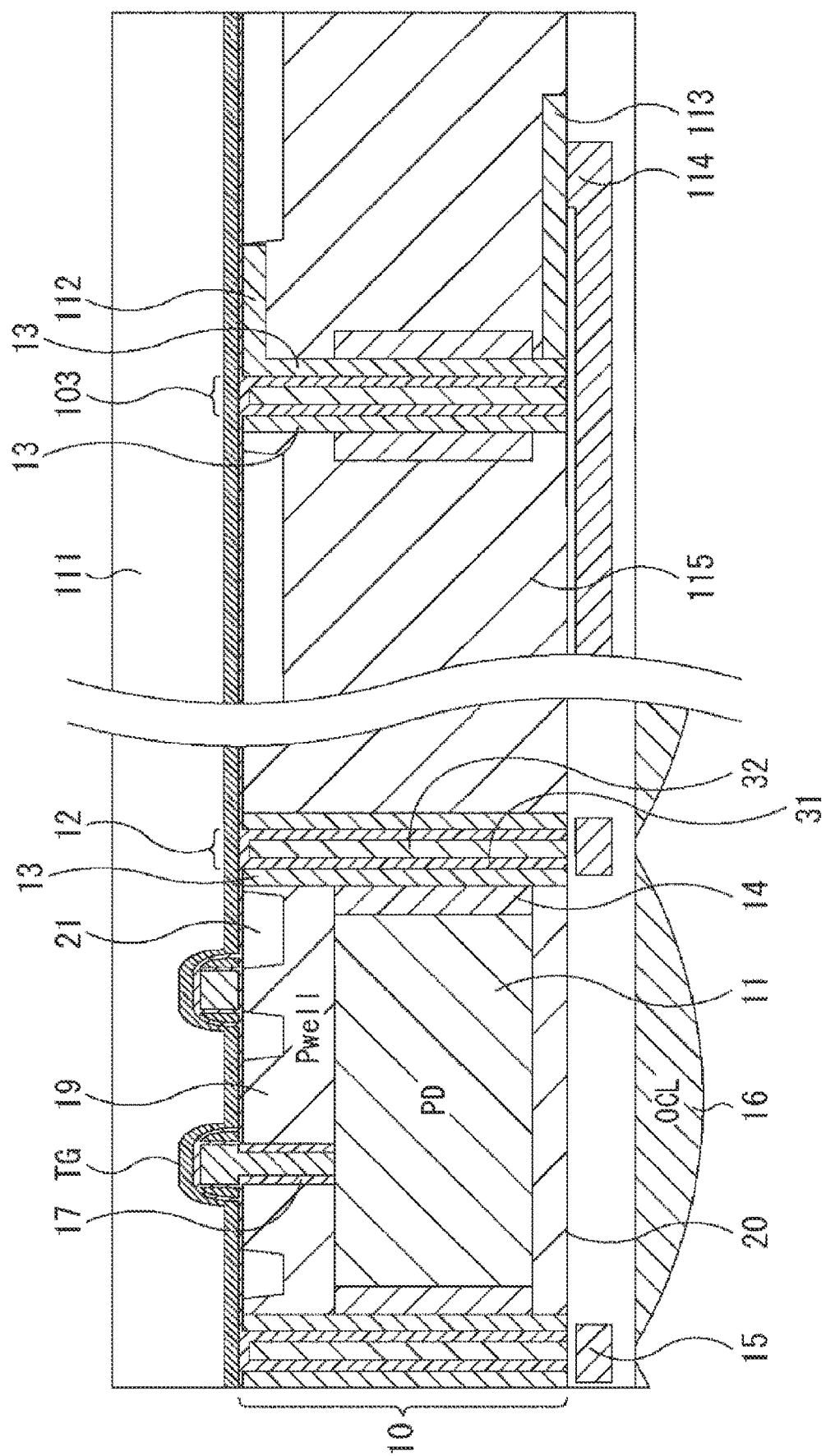
FIG. 15 is a vertical cross-sectional view showing a tenth configuration example of the solid-state imaging apparatus to which the present technology is applied.

FIG. 15 is a vertical cross-sectional view showing a tenth configuration example (tenth embodiment) of the solid-state imaging apparatus to which the present technology is applied.

The tenth embodiment includes a pixel array portion (left side in figure) configured in a manner similar to that of the first embodiment and a peripheral circuit portion 111.

The solid-phase diffusion trench 103 is formed in the peripheral circuit portion 111. The solid-phase diffusion trench 103 is formed in a manner similar to the DTI 12 of the first embodiment. A front side (upper side in the figure) of the P-type solid-phase diffusion layer 13 formed along the solid-phase diffusion trench 103 is electrically connected to a P+ diffusion layer 112 formed in the front surface of the Si substrate 10. Further, the back side (lower side in the figure) of the P-type solid-phase diffusion layer is electrically connected to a Pwell region 113 formed near the backside Si interface 20 or a hole layer 115 formed by a pinning film in the vicinity of a backside interface of the Si substrate 10. The Pwell region 113 is connected to the light-shielding film 15 made of metal material such as W through a backside contact 114. With this, the front side and the back side of the Si substrate 10 are electrically connected to each other and fixed to potential of the light-shielding film 15.

In the tenth embodiment, the P-type solid-phase diffusion layer 13 can also serve as the Pwell region, which have been traditionally necessary for connecting the front side and the back side of the Si substrate 10 to each other. Thus, the number of steps of forming this Pwell region can be reduced.

Eleventh Embodiment

Figure 16:
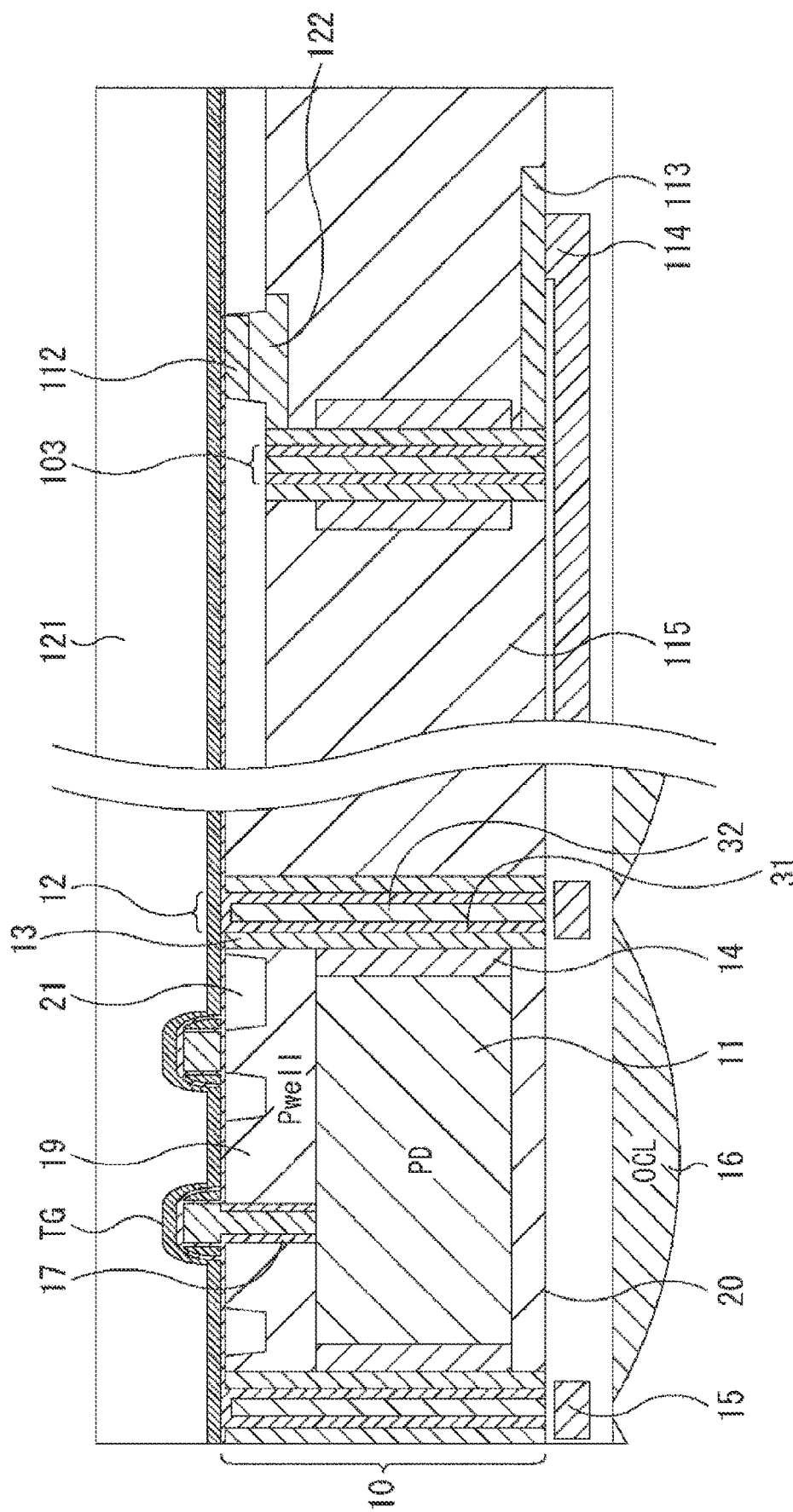
FIG. 16 is a vertical cross-sectional view showing an eleventh configuration example of the solid-state imaging apparatus to which the present technology is applied.

FIG. 16 is a vertical cross-sectional view showing an eleventh configuration example (eleventh embodiment) of the solid-state imaging apparatus to which the present technology is applied.

The eleventh embodiment includes a pixel array portion (left side in figure) configured in a manner similar to that of the first embodiment and a peripheral circuit portion 121.

The solid-phase diffusion trench 103 is formed in the peripheral circuit portion 121. The solid-phase diffusion trench 103 is formed in a manner similar to the DTI 12 of the first embodiment. The front side (upper side in the figure) of the P-type solid-phase diffusion layer 13 formed along the solid-phase diffusion trench 103 is electrically connected to the P+ diffusion layer 112 formed in the front surface of the Si substrate 10 through a Pwell region 122. Further, the back side (lower side in the figure) of the P-type solid-phase diffusion layer is electrically connected to the Pwell region 113 formed near the backside Si interface 20 or to a hole layer 115. The Pwell region 113 is connected to the light-shielding film 15 made of metal material such as W through the backside contact 114. With this, the front side and the back side of the Si substrate 10 are electrically connected to each other and fixed to the potential of the light-shielding film 15.

In the tenth embodiment, the P-type solid-phase diffusion layer 13 can also serve as the Pwell region, which have been traditionally necessary for connecting the front side and the back side of the Si substrate 10 to each other. Thus, the number of steps of forming this Pwell region can be reduced.

Twelfth Embodiment

Figure 17:
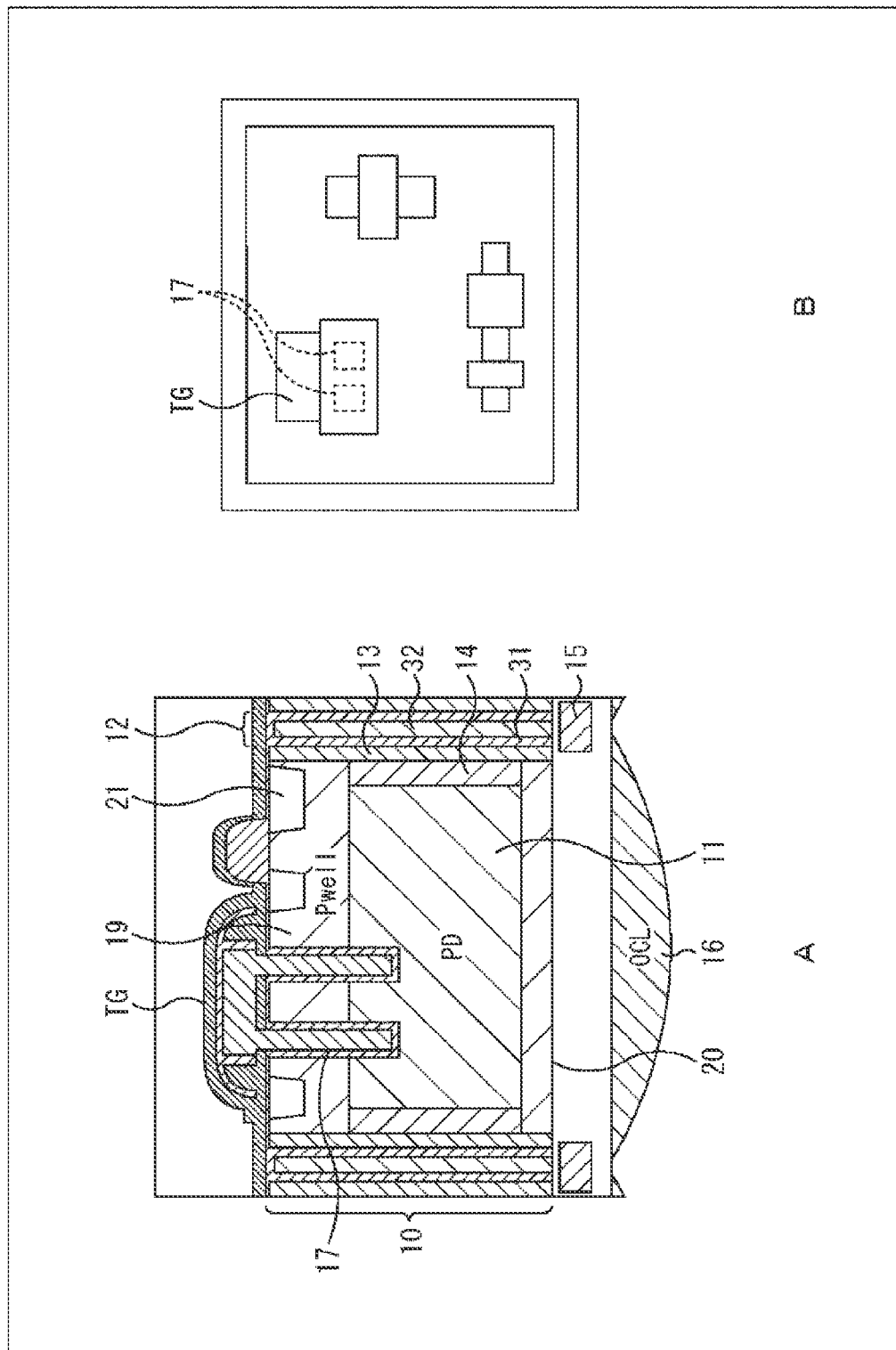
FIG. 17 is a vertical cross-sectional view and a plan view showing a twelfth configuration example of the solid-state imaging apparatus to which the present technology is applied.

FIG. 17 shows a twelfth configuration example (twelfth embodiment) of the solid-state imaging apparatus to which the present technology is applied. A of FIG. 17 is a vertical cross-sectional view and B of FIG. 17 is a plan view.

The twelfth embodiment is different in that the TG is formed of two vertical-type transistor trenches 17, from the first embodiment (the TG is formed of the single vertical-type transistor trench 17). Other configurations are similar to those of the first embodiment. Note that two or more vertical-type transistor trenches 17 may be formed in each pixel region.

In the twelfth embodiment, the followability of potential of the region sandwiched by the two vertical-type transistor trenches 17 when potential of the TG is changed is enhanced. Thus, the degree of modulation can be increased. As a result, transfer efficiency of electric charge can be improved.

Thirteenth Embodiment

Figure 18:
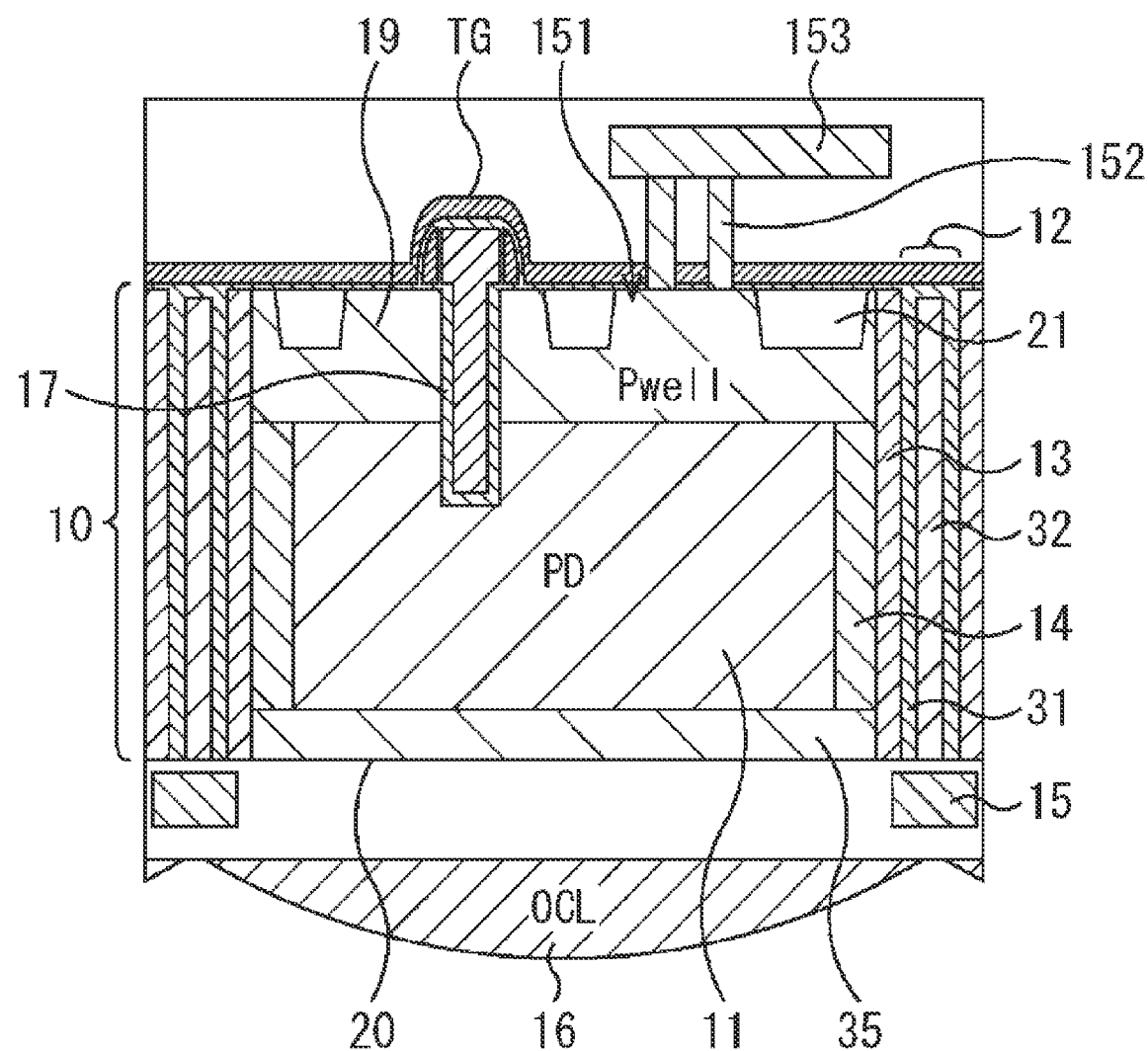
FIG. 18 is a vertical cross-sectional view showing a thirteenth configuration example of the solid-state imaging apparatus to which the present technology is applied.

FIG. 18 is a vertical cross-sectional view showing a thirteenth configuration example (thirteenth embodiment) of the solid-state imaging apparatus to which the present technology is applied.

The thirteenth embodiment is different from the first embodiment in that two contacts 152 are formed in a well contact portion 151 formed in the active region 19. Other configurations are similar to those of the first embodiment. Note that two or more contacts 152 may be formed in the well contact portion 151.

Thus, the thirteenth embodiment can obtain effects similar to those of the first embodiment and can also improve a yield to be a major defect.

Fourteenth Embodiment

Figure 19:
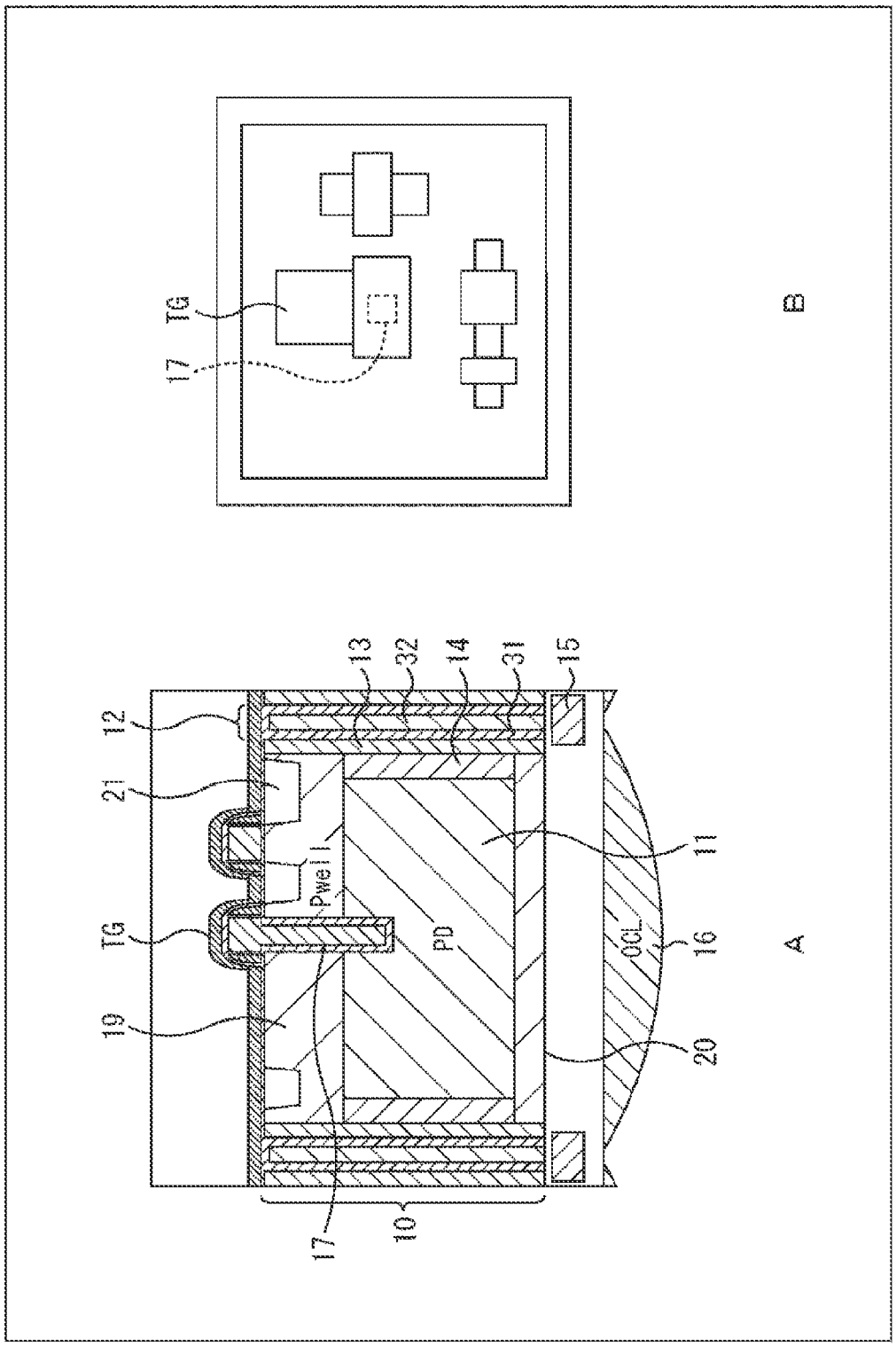
FIG. 19 is a vertical cross-sectional view and a plan view showing a fourteenth configuration example of the solid-state imaging apparatus to which the present technology is applied.

FIG. 19 shows a fourteenth configuration example (fourteenth embodiment) of the solid-state imaging apparatus to which the present technology is applied. A of FIG. 19 is a vertical cross-sectional view and B of FIG. 19 is a plan view.

The fourteenth embodiment is different from the first embodiment in that the TG is formed in such a manner that the vertical-type transistor trench 17 is opened at a center of a pixel, in other words, the TG is present at the same distance from each of outer peripheral ends of the PD 11. Other configurations are similar to those of the first embodiment.

Thus, the fourteenth embodiment can obtain effects similar to those of the first embodiment and can also improve transferring of electric charge because the TG is present at the same distance from each of the outer peripheral ends of the PD 11.

Fifteenth Embodiment

Figure 20:
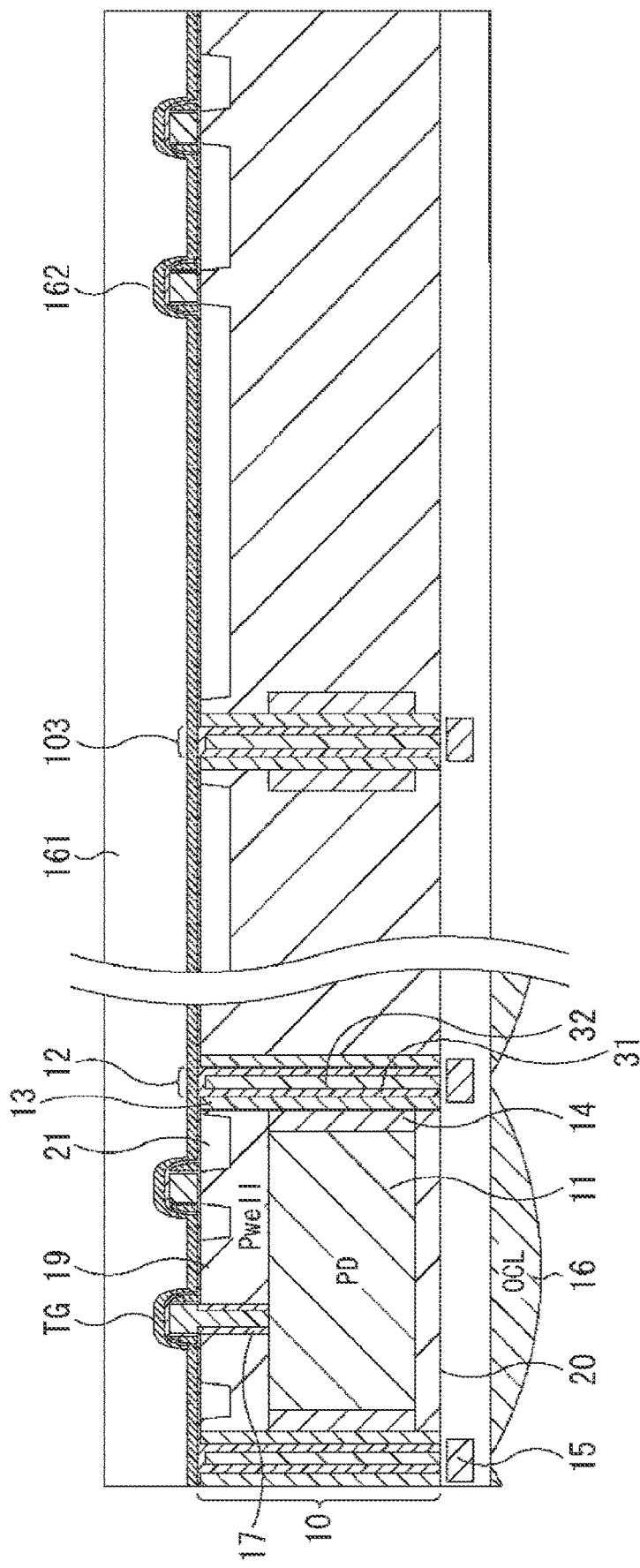
FIG. 20 is a vertical cross-sectional view showing a fifteenth configuration example of the solid-state imaging apparatus to which the present technology is applied.

FIG. 20 is a vertical cross-sectional view showing a fifteenth configuration example (fifteenth embodiment) of the solid-state imaging apparatus to which the present technology is applied.

The fifteenth embodiment includes a pixel array portion (left side in figure) configured in a manner similar to that of the first embodiment and a peripheral circuit portion 161.

A boundary portion 162 is positioned at a boundary between the pixel array portion and the peripheral circuit portion 161. In the boundary portion 162, the solid-phase diffusion trench 103 is formed in a manner similar to the DTI 12 of the first embodiment.

Thus, the fifteenth embodiment can obtain effects similar to those of the first embodiment and can also prevent emitted light which can be produced in the peripheral circuit portion 161 from entering the pixel array portion due to the solid-phase diffusion trench 103.

Sixteenth Embodiment

Figure 21:
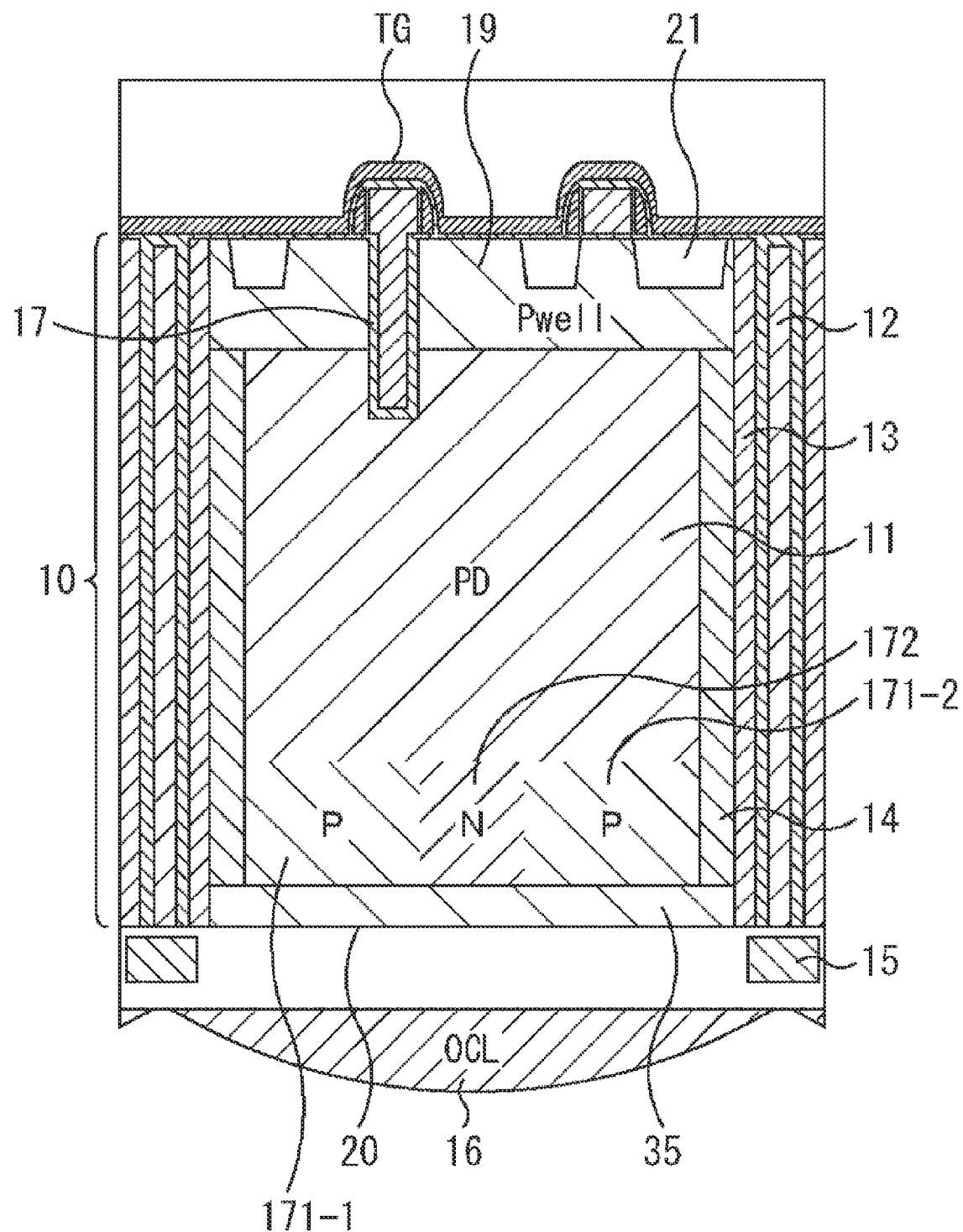
FIG. 21 is a vertical cross-sectional view showing a sixteenth configuration example of the solid-state imaging apparatus to which the present technology is applied.

FIG. 21 is a vertical cross-sectional view showing a sixteenth configuration example (sixteenth embodiment) of the solid-state imaging apparatus to which the present technology is applied.

As compared to the PD 11 of the seventh embodiment shown in FIG. 11 (the length of the Si substrate 10 and the like in the depth direction is extended), in the sixteenth embodiment, a P-type region 171-1, an N-type region 172, and a P-type region 171-2 are formed on the back side thereof by ion implantation. Intense electric fields are generated in those PN-junction portions and can retain electric charge.

Thus, the sixteenth embodiment can obtain effects similar to those of the first embodiment and can also further increase the saturation charge amount Qs in comparison with the seventh embodiment.

Seventeenth Embodiment

Figure 22:
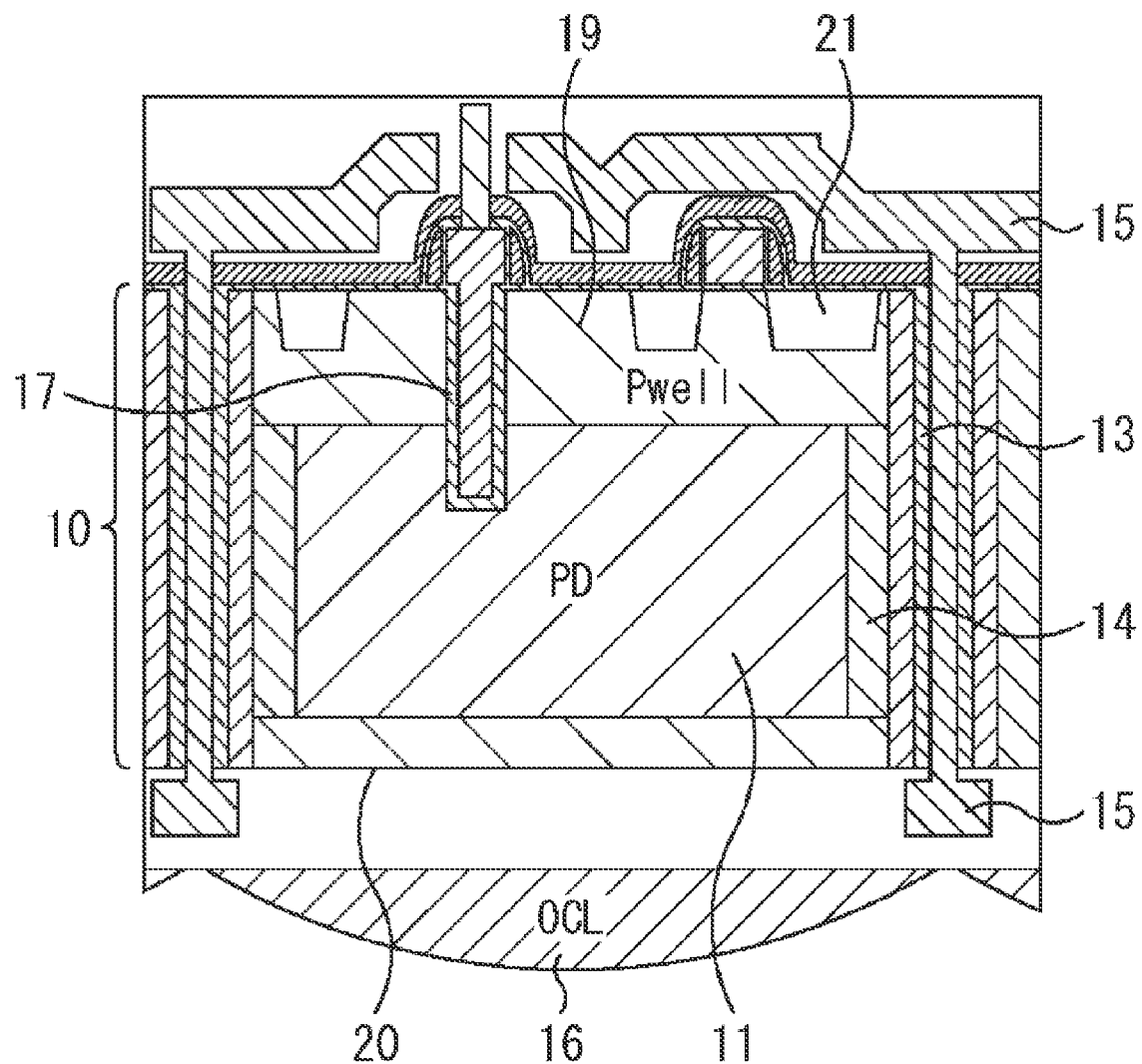
FIG. 22 is a vertical cross-sectional view showing a seventeenth configuration example of the solid-state imaging apparatus to which the present technology is applied.

FIG. 22 is a vertical cross-sectional view showing a seventeenth configuration example (seventeenth embodiment) of the solid-state imaging apparatus to which the present technology is applied.

The seventeenth embodiment is different from the first embodiment in that the inside of the DTI 12 is filled with the same metal material (W) as the light-shielding film 15 covering the back side (lower side in the figure) of the DTI 12 and the front side of the Si substrate 10 (upper side in the figure) is also covered, specifically, a portion other than the back surface of each pixel region is surrounded with the metal material. Other configurations are similar to those of the first embodiment. Note that metal material other than W may be used for the light-shielding film 15 and the like.

This prevents incident light from leaking out to neighboring pixels. Thus, color mixing is prevented. Further, light entering from the back side and reaching the front side without experiencing photoelectric conversion is reflected by the metal material and enters the PD 11 again.

Thus, the seventeenth embodiment can obtain effects similar to those of the first embodiment and can also further enhance sensitivity of the PD 11.

Note that the above-mentioned first to seventeenth embodiments can be combined as appropriate.

First Modified Example

Although, in each of the above-mentioned first to seventeenth embodiments, each pixel includes the FD and the pixel transistor, a plurality of pixels may share the FD and the pixel transistor 18.

Figure 23:
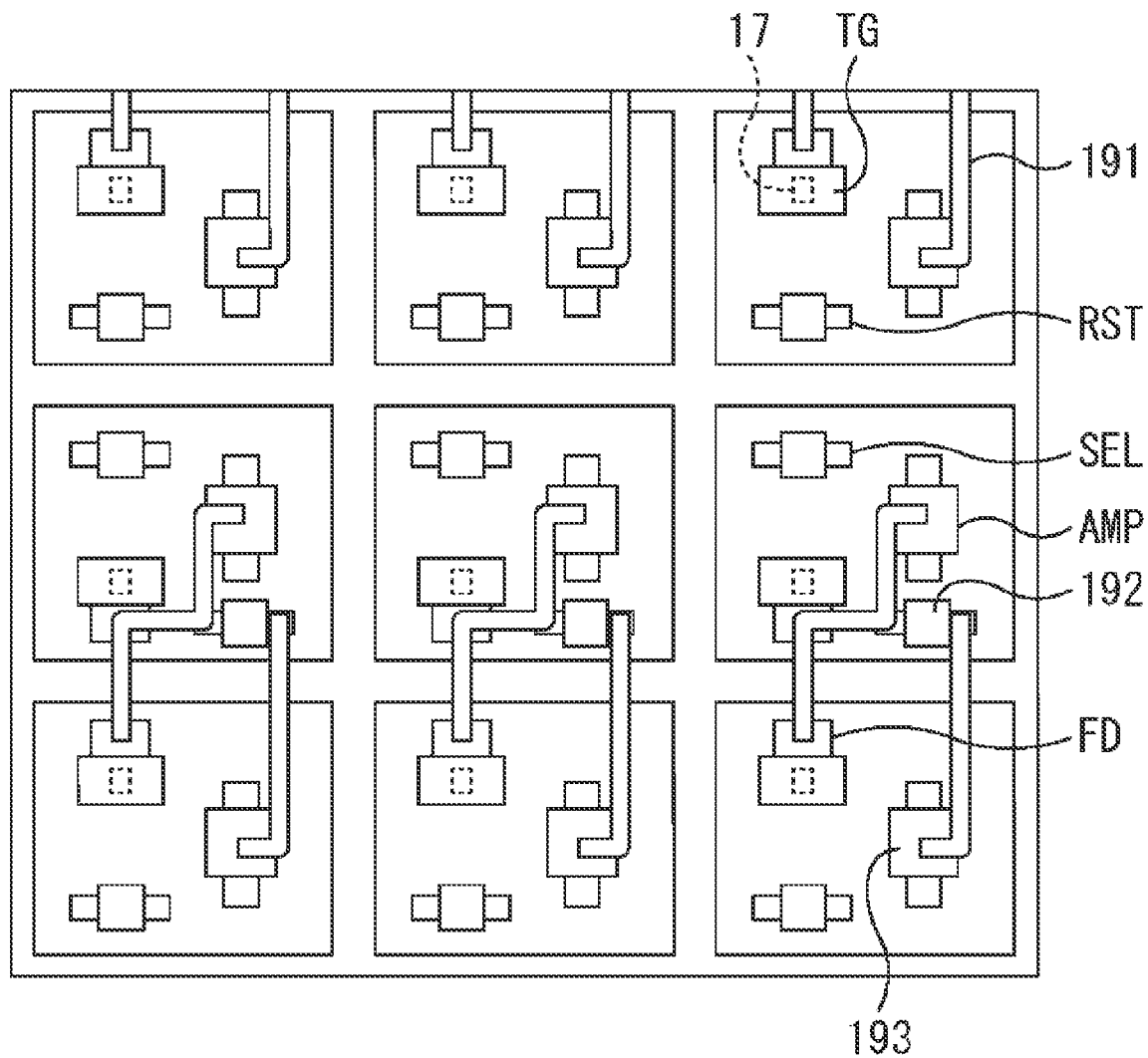
FIG. 23 is a plan view showing a configuration example in a case of sharing an FD and the like with two pixels.

FIG. 23 shows a plan view in a case where two pixels adjacent to each other in a vertical direction share the FD and the pixel transistor 18.

In the case of FIG. 23, the number of elements per pixel decreases and an occupation area in each pixel is sufficiently large. Thus, a conversion efficiency-switching transistor 192 and an MOS capacitor 193 to be added to the FD are provided.

The conversion efficiency-switching transistor 192 switches to high conversion efficiency for an application intended to enhance a sensitivity output and switches to low conversion efficiency for an application intended to increase the saturation charge amount Qs.

The MOS capacitor 193 added to the FD can increase the FD capacity. Thus, the low conversion efficiency can be realized, and it is possible to increase the saturation charge amount Qs.

Other Modified Examples

The first to seventeenth embodiments can also be applied to a solid-state imaging apparatus formed by stacking a plurality of substrates as described below, for example.

Figure 24:
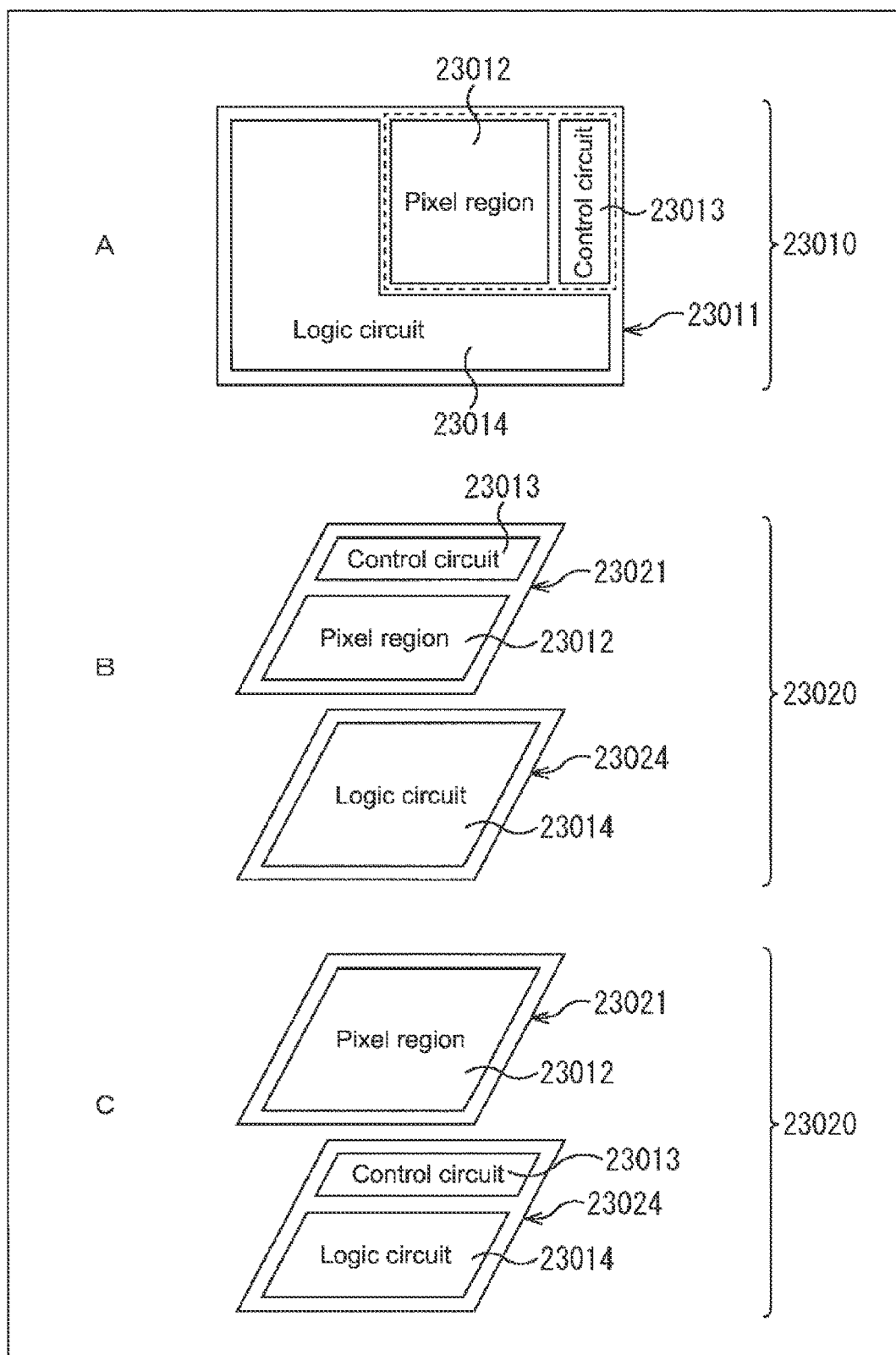
FIG. 24 is a diagram showing the outline of a configuration example of a stacked-type solid-state imaging apparatus to which the technology according to the present disclosure can be applied.

Configuration Example of Stacked-Type Solid-State Imaging Apparatus to Which Technology According to Present Disclosure Can Be Applied FIG. 24 is a diagram showing the outline of a configuration example of the stacked-type solid-state imaging apparatus to which the technology according to the present disclosure can be applied.

A of FIG. 24 shows a schematic configuration example of a non-stacked-type solid-state imaging apparatus. As shown in A of FIG. 24, a solid-state imaging apparatus 23010 includes a single die (semiconductor substrate) 23011. This die 23011 installs a pixel region 23012 in which pixels are arranged in an array, a control circuit 23013 that controls driving of the pixels and performs other various controls, and a logic circuit 23014 for signal processing.

B and C of FIG. 24 show a schematic configuration example of the stacked-type solid-state imaging apparatus. As shown in B and C of FIG. 24, two dies of a sensor die 23021 and a logic die 23024 are stacked and electrically connected to each other. In this manner, the solid-state imaging apparatus 23020 is configured as a single semiconductor chip.

In B of FIG. 24, the sensor die 23021 installs the pixel region 23012 and the control circuit 23013. The logic die 23024 installs the logic circuit 23014 including a signal processing circuit that performs signal processing.

In C of FIG. 24, the sensor die 23021 installs the pixel region 23012. The logic die 23024 installs the control circuit 23013 and the logic circuit 23014.

Figure 25:
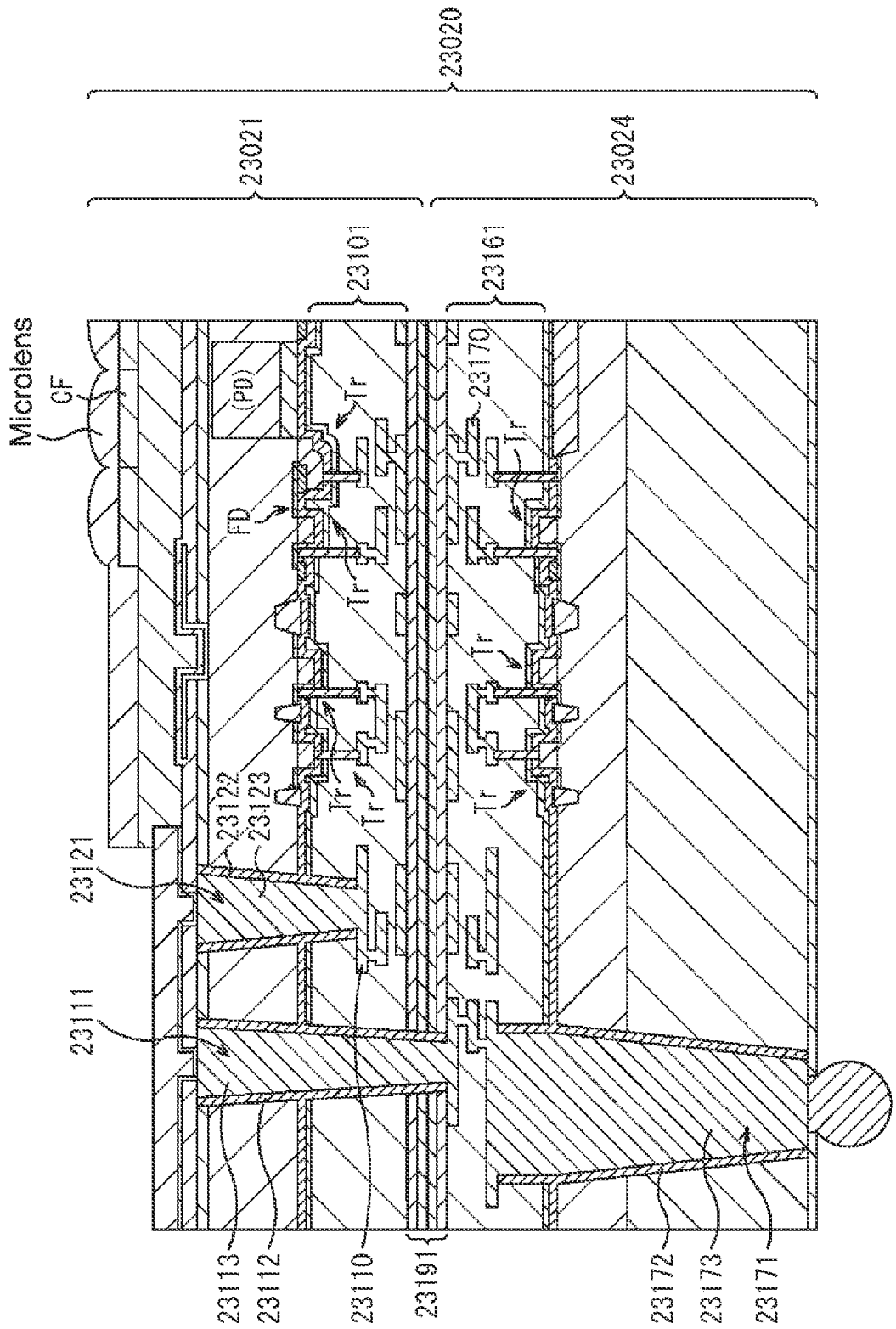
FIG. 25 is a cross-sectional view showing a first configuration example of a stacked-type solid-state imaging apparatus 23020.

FIG. 25 is a cross-sectional view showing a first configuration example of the stacked-type solid-state imaging apparatus 23020.

In the sensor die 23021, a photodiode (PD), a floating diffusion (FD), and transistors (Tr) (MOS FET), which constitute a pixel that becomes the pixel region 23012, and Tr and the like, which become the control circuit 23013, are formed. In addition, a wiring layer 23101 is formed in the sensor die 23021. The wiring layer 23101 includes a plurality of layers, in this example, three-layer wires 23110. Note that (Tr that becomes) the control circuit 23013 can be formed in not the sensor die 23021 but the logic die 23024.

Tr constituting the logic circuit 23014 is formed in the logic die 23024. In addition, a wiring layer 23161 is formed in the logic die 23024. The wiring layer 23161 includes a plurality of layers, in this example, three-layer wires 23170. Further, a connection hole 23171 is formed in the logic die 23024. The connection hole 23171 has an insulation film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. With this, the stacked-type solid-state imaging apparatus 23020 in which the sensor die 23021 and the logic die 23024 are stacked is formed. A film 23191 such as a protection film is formed in a face on which the sensor die 23021 and the logic die 23024 are bonded to each other.

A connection hole 23111 is formed in the sensor die 23021. The connection hole 23111 penetrates the sensor die 23021 from the backside (side on which light enters the PD) (upper side) of the sensor die 23021 and reaches an uppermost layer wire 23170 of the logic die 23024. In addition, a connection hole 23121 is formed in the sensor die 23021. The connection hole 23121 is located in proximity of the connection hole 23111 and reaches a first-layer wire 23110 from the backside of the sensor die 23021. An insulation film 23112 is formed on an inner wall surface of the connection hole 23111. An insulation film 23122 is formed on an inner wall surface of the connection hole 23121. Then, connection conductors 23113 and 23123 are embedded in the connection holes 23111 and 23121, respectively. The connection conductor 23113 and the connection conductor 23123 electrically connected to each other on the back side of the sensor die 23021. With this, the sensor die 23021 and the logic die 23024 are electrically connected to each other via the wiring layer 23101, the connection hole 23121, the connection hole 23111, and the wiring layer 23161.

Figure 26:
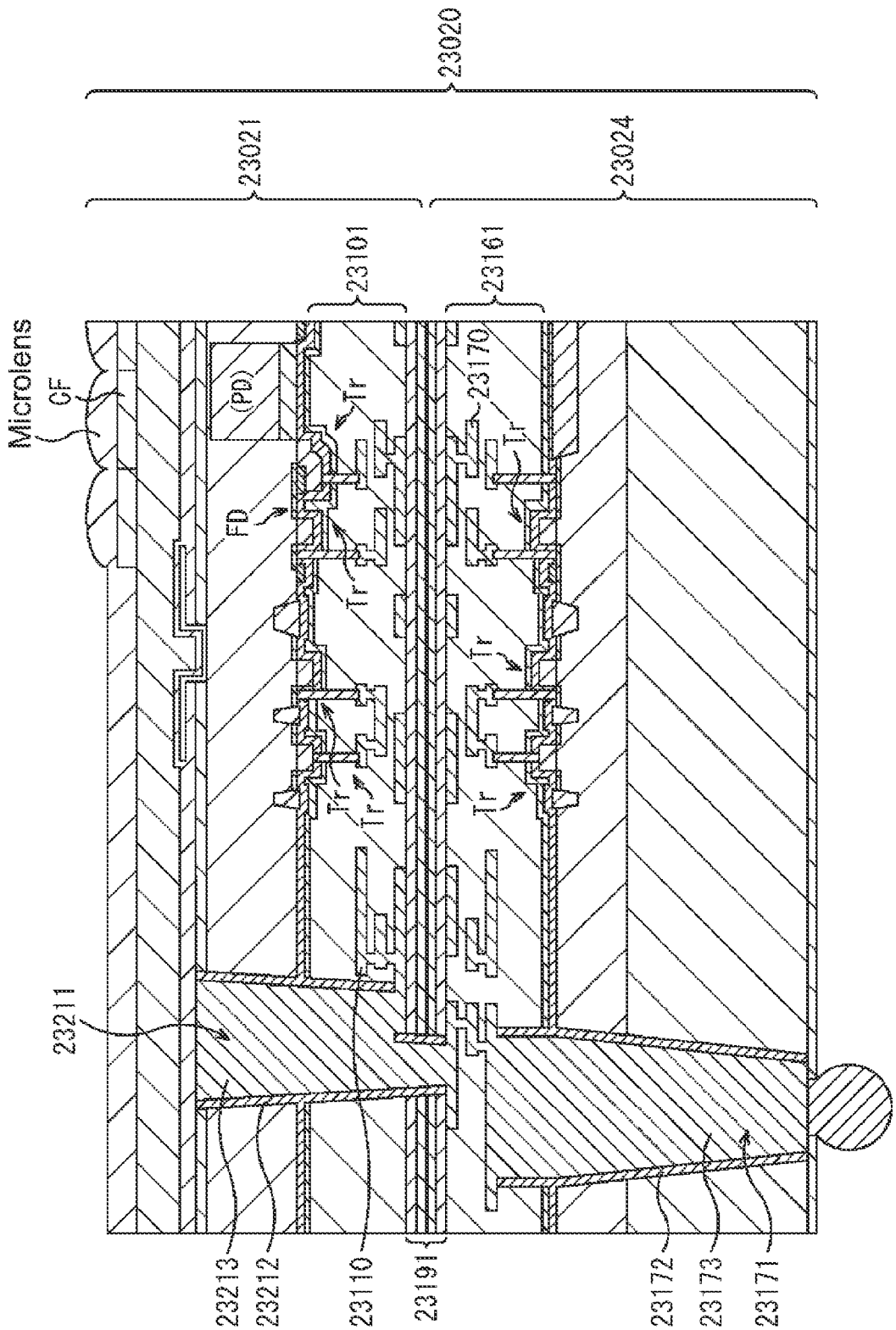
FIG. 26 is a cross-sectional view showing a second configuration example of the stacked-type solid-state imaging apparatus 23020.

FIG. 26 is a cross-sectional view showing a second configuration example of the stacked-type solid-state imaging apparatus 23020.

In a second configuration example of the solid-state imaging apparatus 23020, ((the wire 23110 of) the wiring layer 23101 of) the sensor die 23021 and ((the wire 23170 of) the wiring layer 23161 of) the logic die 23024 are electrically connected to each other through a single connection hole 23211 formed in the sensor die 23021.

That is, in FIG. 26, the connection hole 23211 is formed penetrating the sensor die 23021 from the back side of the sensor die 23021 and reaching an uppermost layer wire 23170 of the logic die 23024 and an uppermost layer wire 23110 of the sensor die 23021. An insulation film 23212 is formed on the inner wall surface of the connection hole 23211. A connection conductor 23213 is embedded in the connection hole 23211. In FIG. 25 described above, the sensor die 23021 and the logic die 23024 are electrically connected to each other through the two connection holes 23111 and 23121. On the other hand, in FIG. 26, the sensor die 23021 and the logic die 23024 are electrically connected to each other through the single connection hole 23211.

Figure 27:
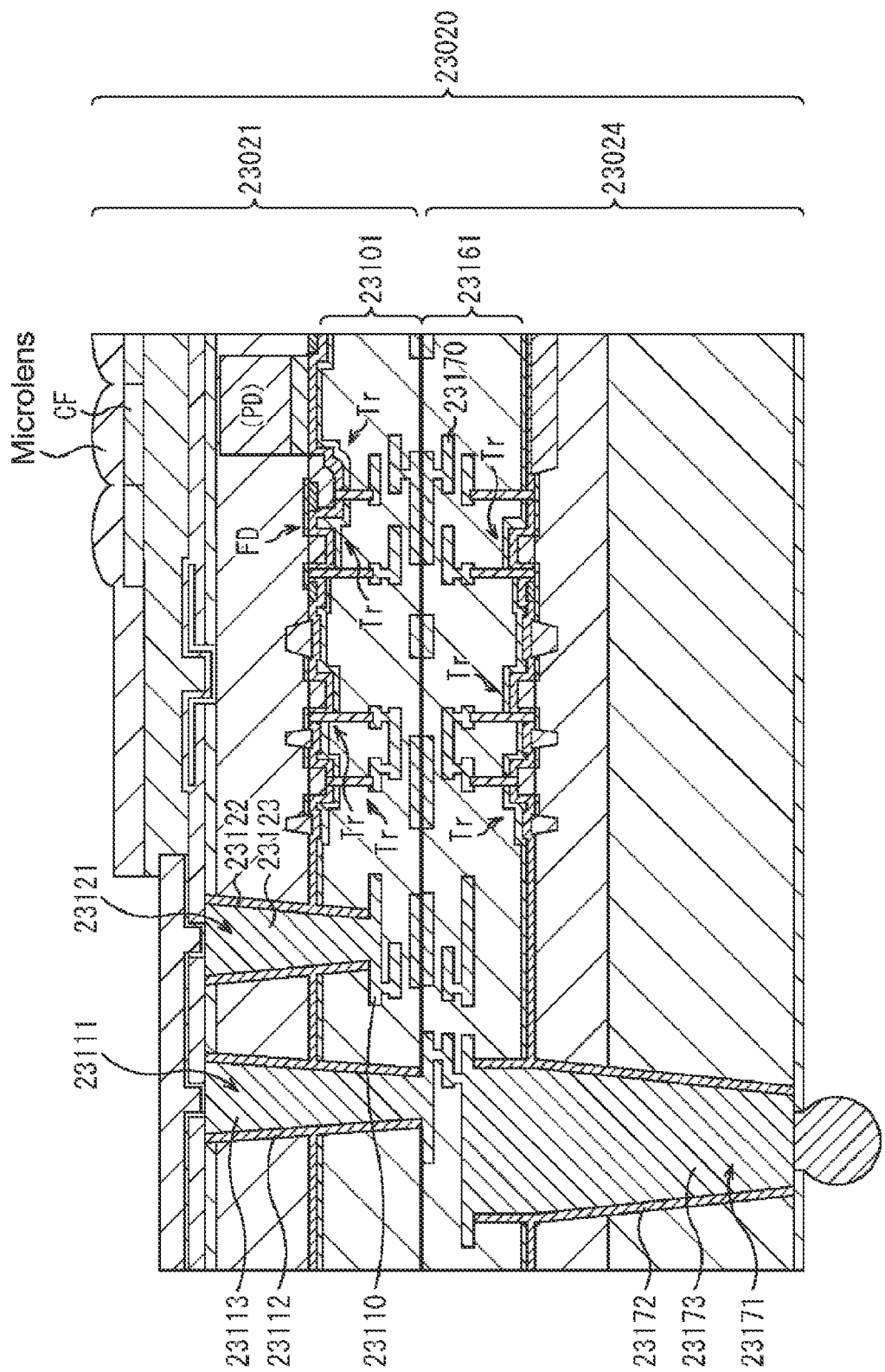
FIG. 27 is a cross-sectional view showing a third configuration example of the stacked-type solid-state imaging apparatus 23020.

FIG. 27 is a cross-sectional view showing a third configuration example of the stacked-type solid-state imaging apparatus 23020.

In the solid-state imaging apparatus 23020 of FIG. 27, the film 23191 such as the protection film is not formed in a face on which the sensor die 23021 and the logic die 23024 are bonded to each other. In the case of FIG. 25, the film 23191 such as the protection film is formed in the face on which the sensor die 23021 and the logic die 23024 are bonded to each other. In this point, the solid-state imaging apparatus 23020 of FIG. 27 is different from the case of FIG. 25.

The sensor die 23021 and the logic die 23024 are superimposed on each other such that the wires 23110 and 23170 are held in direct contact. Then, the wires 23110 and 23170 are directly joined with each other by heating the wires 23110 and 23170 while adding necessary weight on the wires 23110 and 23170. In this manner, the solid-state imaging apparatus 23020 of FIG. 27 is formed.

Figure 28:
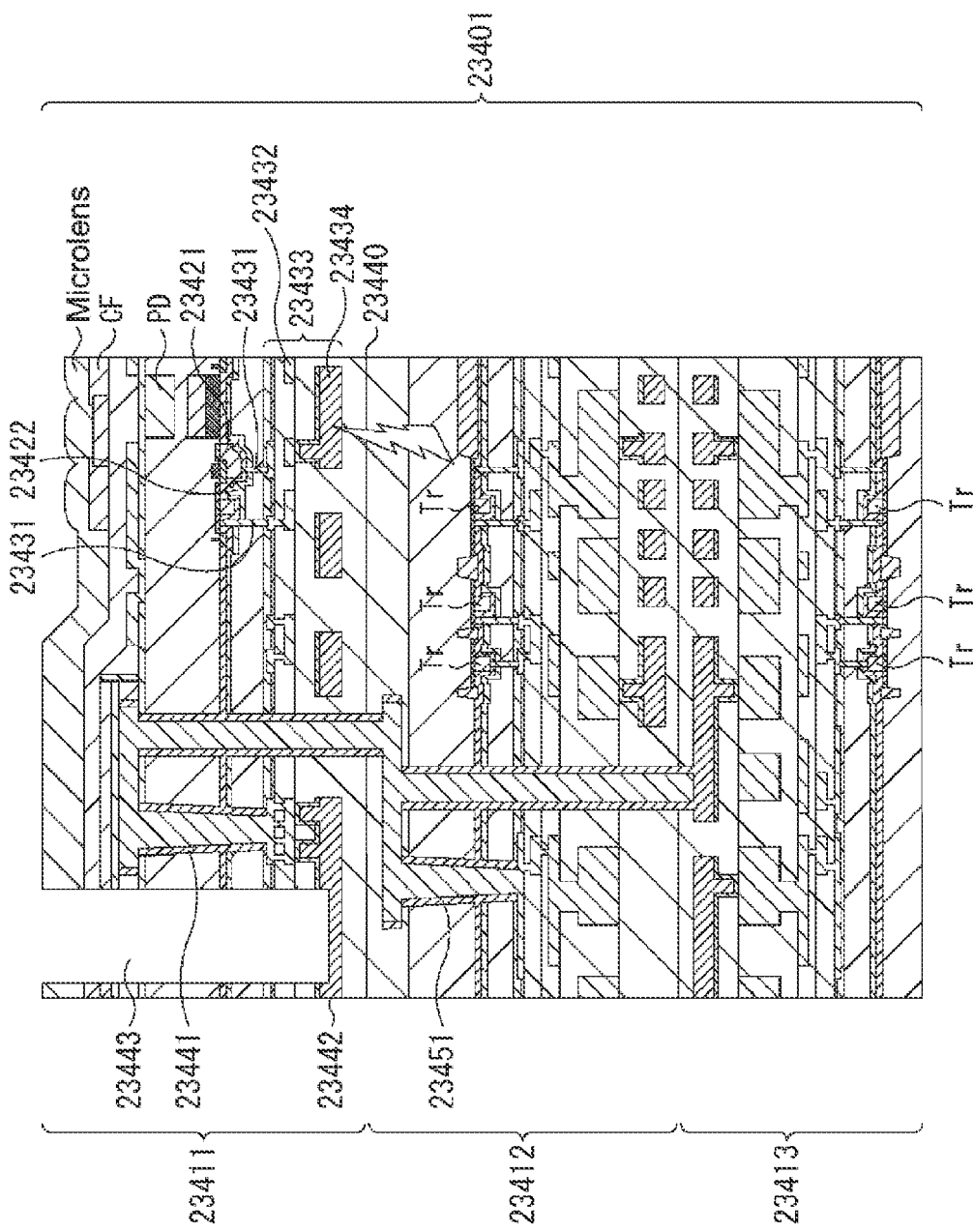
FIG. 28 is a cross-sectional view showing another configuration example of the stacked-type solid-state imaging apparatus to which the technology according to the present disclosure can be applied.

FIG. 28 is a cross-sectional view showing another configuration example of the stacked-type solid-state imaging apparatus to which the technology according to the present disclosure can be applied.

In FIG. 28, a solid-state imaging apparatus 23401 has a three-layer laminate structure. In this three-layer laminate structure, three dies of a sensor die 23411, a logic die 23412, and a memory die 23413 are stacked.

The memory die 23413 includes a memory circuit. The memory circuit stores data temporarily necessary in signal processing performed in the logic die 23412, for example.

In FIG. 28, the logic die 23412 and the memory die 23413 are stacked below the sensor die 23411 in the stated order. However, the logic die 23412 and the memory die 23413 may be stacked below the sensor die 23411 in inverse order, i.e., in the order of the memory die 23413 and the logic die 23412.

Note that, in FIG. 28, a PD that becomes a photoelectric converter of the pixel and source/drain regions of a pixel Tr are formed in the sensor die 23411.

A gate electrode is formed via a gate insulation film around the PD. A pixel Tr 23421 and a pixel Tr 23422 are formed by the gate electrode and the paired source/drain regions.

The pixel Tr 23421 adjacent to the PD is a transfer Tr. One of the paired source/drain regions that constitute the pixel Tr 23421 is an FD.

Further, an inter-layer insulation film is formed in the sensor die 23411. A connection hole is formed in the inter-layer insulation film. The pixel Tr 23421 and connection conductors 23431 that connects to the pixel Tr 23422 are formed in the connection hole.

In addition, a wiring layer 23433 having a plurality of layers with layer wires 23432 which connect to each of the connection conductors 23431 is formed in the sensor die 23411.

Further, an aluminum pad 23434 that becomes an electrode for external connection is formed in a lowermost layer of the wiring layer 23433 of the sensor die 23411. That is, in the sensor die 23411, the aluminum pad 23434 is formed at a position closer to a surface 23440 bonding with the logic die 23412 than the wires 23432. The aluminum pad 23434 is used as one end of a wire associated with input/output of signals into/from the outside.

In addition, a contact 23441 used for electric connection with the logic die 23412 is formed in the sensor die 23411. The contact 23441 is connected to a contact 23451 of the logic die 23412 and also connected to an aluminum pad 23442 of the sensor die 23411.

Then, a pad hole 23443 is formed in the sensor die 23411, reaching the aluminum pad 23442 from a backside (upper side) of the sensor die 23411.

The technology according to the present disclosure can be applied to the solid-state imaging apparatus as described above.

Example of Application to Internal Information Acquisition System

The technology according to the present disclosure (present technology) may be applied to various products. For example, the technology according to the present disclosure may be applied to an endoscopic surgery system.

Figure 29:
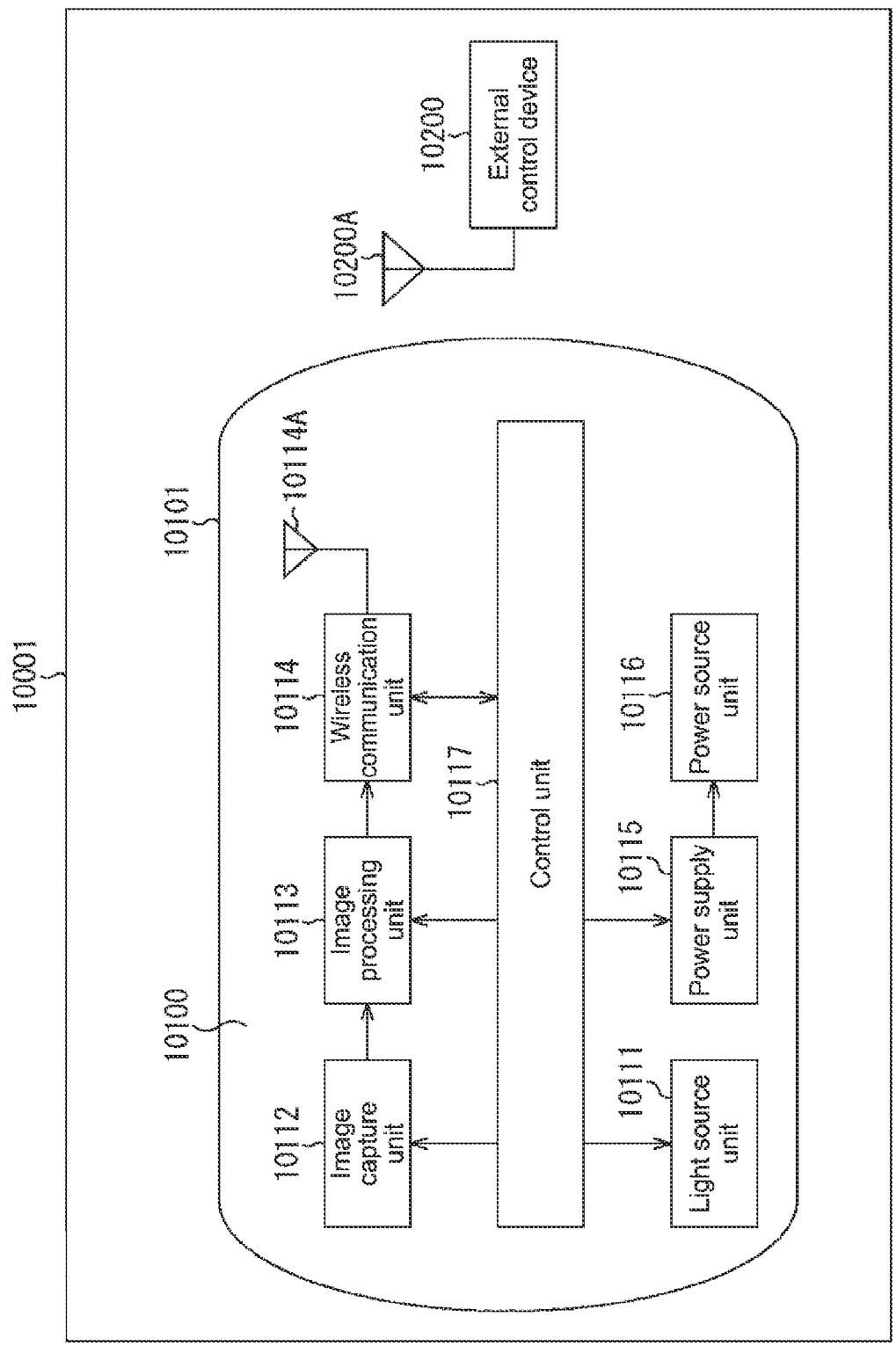
FIG. 29 is a block diagram showing an example of a schematic configuration of an internal information acquisition system.

FIG. 29 is a block diagram showing an example of a schematic configuration of an internal information acquisition system for a patient, which uses an endoscopic capsule, to which the technology according to the present disclosure may be applied.

An internal information acquisition system 10001 includes an endoscopic capsule 10100 and an external control device 10200.

The endoscopic capsule 10100 is swallowed by a patient in an examination. The endoscopic capsule 10100 has an image capture function and a wireless communication function. The endoscopic capsule 10100 moves through the interior of organs such as the stomach and the intestines by peristaltic movement or the like until being excreted naturally from the patient, while also successively capturing images (hereinafter, also referred to as internal images) of the interior of the relevant organs at predetermined intervals, and successively wirelessly transmitting information about the internal images to the external control device 10200 outside the body.

The external control device 10200 centrally controls the operation of the internal information acquisition system 10001. Further, the external control device 10200 receives information about the internal images transmitted from the endoscopic capsule 10100. Based on the received information about the internal images, the external control device 10200 generates image data for displaying the internal images on a display device (not shown).

In this way, with the internal information acquisition system 10001, images depicting the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source unit 10111, an image capture unit 10112, an image processing unit 10113, a wireless communication unit 10114, a power supply unit 10115, a power source unit 10116, and a control unit 10117 built in the capsule-shaped housing 10101.

The light source unit 10111 includes a light source such as a light-emitting diode (LED), for example, and irradiates the imaging field of the image capture unit 10112 with light.

The image capture unit 10112 includes an image sensor, and an optical system made up of multiple lenses provided in front of the image sensor. Reflected light (hereinafter, referred to as observation light) from the light radiated to a body tissue which is an object of observation is condensed by the optical system and incident on the image sensor. The image sensor of the image capture unit 10112 receives and photoelectrically converts the observation light, to thereby generate an image signal corresponding to the observation light. The image signal generated by the image capture unit 10112 is provided to the image processing unit 10113.

The image processing unit 10113 includes a processor such as a central processing unit (CPU) or a graphics processing unit (GPU), and performs various types of signal processing on the image signal generated by the image capture unit 10112. The image processing unit 10113 provides the image signal subjected to the signal processing to the wireless communication unit 10114 as raw data.

The wireless communication unit 10114 performs predetermined processing such as modulation processing on the image signal that was subjected to the signal processing by the image processing unit 10113, and transmits the image signal to the external control device 10200 via an antenna 10114A. In addition, the wireless communication unit 10114 receives, from the external control device 10200 via the antenna 10114A, a control signal related to driving control of the endoscopic capsule 10100. The wireless communication unit 10114 provides control signals received from the external control device 10200 to the control unit 10117.

The power supply unit 10115 includes, for example, an antenna coil for receiving power, a power regeneration circuit for regenerating power from a current produced in the antenna coil, and a voltage step-up circuit. In the power supply unit 10115, the principle of what is called contactless or wireless charging is used for generating power.

The power source unit 10116 includes a secondary battery, and stores power generated by the power supply unit 10115. FIG. 29 omits arrows or the like indicating the recipients of power from the power source unit 10116 for brevity, but power stored in the power source unit 10116 is supplied to the light source unit 10111, the image capture unit 10112, the image processing unit 10113, the wireless communication unit 10114, and the control unit 10117, and may be used for driving these components.

The control unit 10117 includes a processor such as a CPU. The control unit 10117 appropriately controls driving of the light source unit 10111, the image capture unit 10112, the image processing unit 10113, the wireless communication unit 10114, and the power supply unit 10115 in accordance with a control signal transmitted from the external control device 10200.

The external control device 10200 includes a processor such as a CPU and GPU, a microcomputer or a control board on which a processor and a storage element such as a memory are mounted, and the like. The external control device 10200 controls the operation of the endoscopic capsule 10100 by transmitting a control signal to the control unit 10117 of the endoscopic capsule 10100 via an antenna 10200A. In the endoscopic capsule 10100, for example, a light irradiation condition under which the light source unit 10111 irradiates a target of observation with light may be changed by a control signal from the external control device 10200. In addition, an image capture condition (such as the frame rate and the exposure level in the image capture unit 10112) may be changed by a control signal from the external control device 10200. In addition, the content of processing in the image processing unit 10113 and a condition (such as the transmission interval and the number of images to be transmitted) under which the wireless communication unit 10114 transmits the image signal may be changed by a control signal from the external control device 10200.

In addition, the external control device 10200 performs various types of image processing on the image signal transmitted from the endoscopic capsule 10100, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 10200 controls driving of a display device (not shown), and causes the display device to display a captured internal image on the basis of the generated image data. Alternatively, the external control device 10200 may also cause a recording device (not shown) to record the generated image data, or cause a printing device (not shown) to make a printout of the generated image data.

The above describes an example of the internal information acquisition system to which the technology according to the present disclosure may be applied. The technology according to the present disclosure may be applied to the image capture unit 10112 of the above-mentioned configurations.

Example of Application to Movable Object

The technology according to the present disclosure (present technology) can be applied to various products. The technology according to the present disclosure may be, for example, realized as a device mounted on any kind of movable objects such as a car, an electric car, a hybrid electric car, a motorcycle, a bicycle, a personal mobility, an aircraft, a drone, a ship, and a robot.

Figure 30:
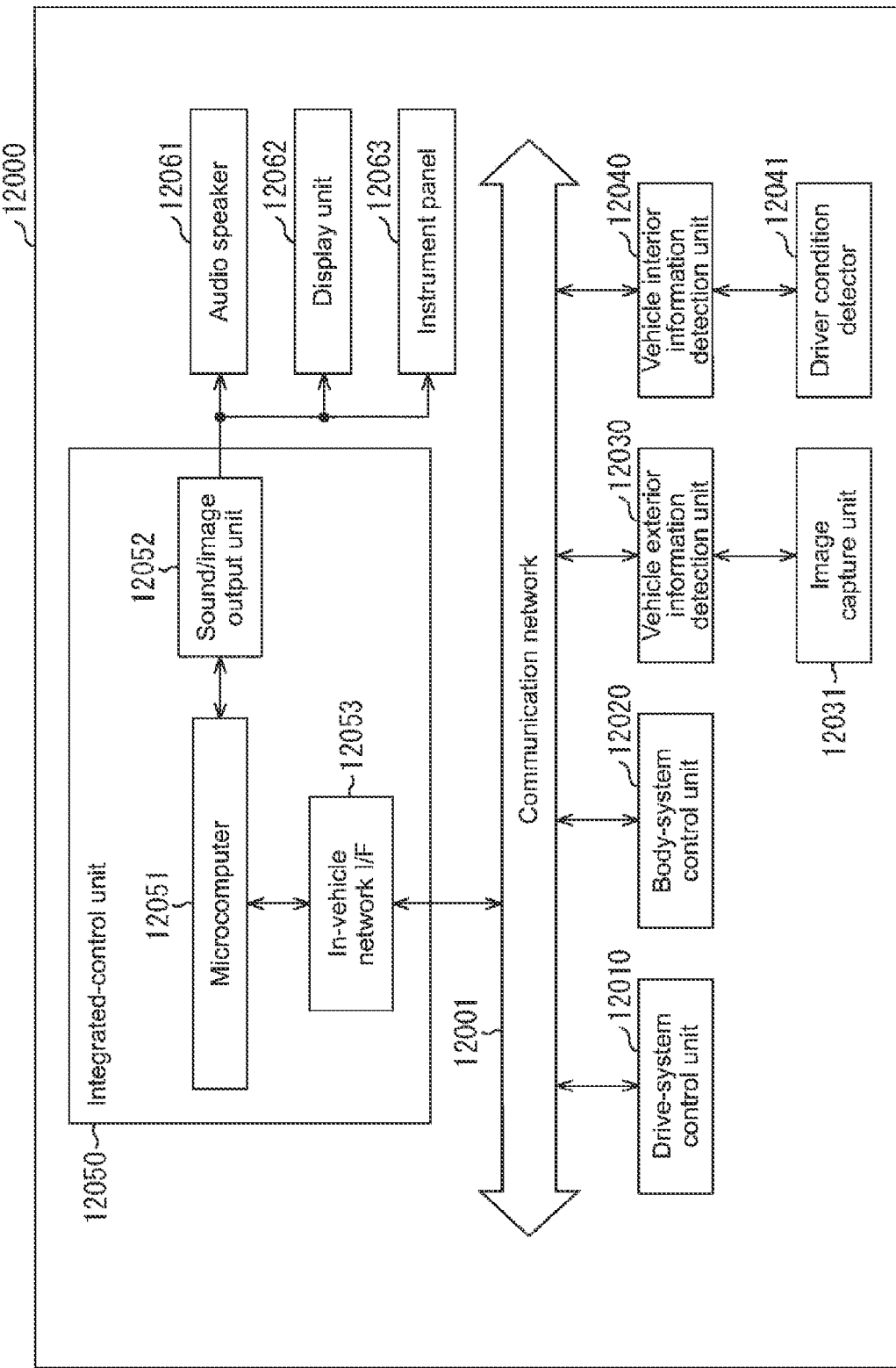
FIG. 30 is a block diagram showing an example of a schematic configuration of a vehicle control system.

FIG. 30 is a block diagram showing an example of a schematic configuration of a vehicle control system, which is an example of a movable object control system to which the technology according to the present disclosure is applied.

A vehicle control system 12000 includes a plurality of electronic control units connected to each other via a communication network 12001. In the example of FIG. 30, the vehicle control system 12000 includes a drive-system control unit 12010, a body-system control unit 12020, a vehicle exterior information detection unit 12030, a vehicle interior information detection unit 12040, and an integrated-control unit 12050. Further, as the functional configuration of the integrated-control unit 12050, a microcomputer 12051, a sound/image output unit 12052, and an in-vehicle network interface (I/F) 12053 are shown.

The drive-system control unit 12010 executes various kinds of programs, to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs, to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The vehicle exterior information detection unit 12030 detects information outside the vehicle including the vehicle control system 12000. For example, an image capture unit 12031 is connected to the vehicle exterior information detection unit 12030. The vehicle exterior information detection unit 12030 causes the image capture unit 12031 to capture an environment image and receives the captured image. The vehicle exterior information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of light received. The image capture unit 12031 may output the electric signal as an image or may output as distance measurement information. Further, the light that the image capture unit 12031 receives may be visible light or invisible light such as infrared light.

The vehicle interior information detection unit 12040 detects vehicle interior information. For example, a driver condition detector 12041 that detects the condition of a driver is connected to the vehicle interior information detection unit 12040. For example, the driver condition detector 12041 may include a camera that captures an image of a driver. The vehicle interior information detection unit 12040 may calculate the fatigue level or the concentration level of the driver on the basis of the detected information input from the driver condition detector 12041, and may determine whether the driver is sleeping.

The microcomputer 12051 may calculate the control target value of the driving force generation device, the steering mechanism, or the brake device on the basis of the vehicle interior/vehicle exterior information obtained by the vehicle exterior information detection unit 12030 or the vehicle interior information detection unit 12040, and may output a control command to the drive-system control unit 12010. For example, the microcomputer 12051 may perform coordinated control for the purpose of realizing the advanced driver assistance system (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the vehicle exterior information detection unit 12030 or the vehicle interior information detection unit 12040, the microcomputer 12051 may perform coordinated control for the purpose of realizing self-driving, i.e., autonomous driving without the need of drivers' operations, and the like.

Further, the microcomputer 12051 may output a control command to the body-system control unit 12020 on the basis of vehicle exterior information obtained by the vehicle exterior information detection unit 12030. For example, the microcomputer 12051 may perform coordinated control including controlling the head lamps on the basis of the location of a leading vehicle or an oncoming vehicle detected by the vehicle exterior information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 30, an audio speaker 12061, a display unit 12062, and an instrument panel 12063 are shown as examples of the output devices. For example, the display unit 12062 may include at least one of an on-board display and a head-up display.

Figure 31:
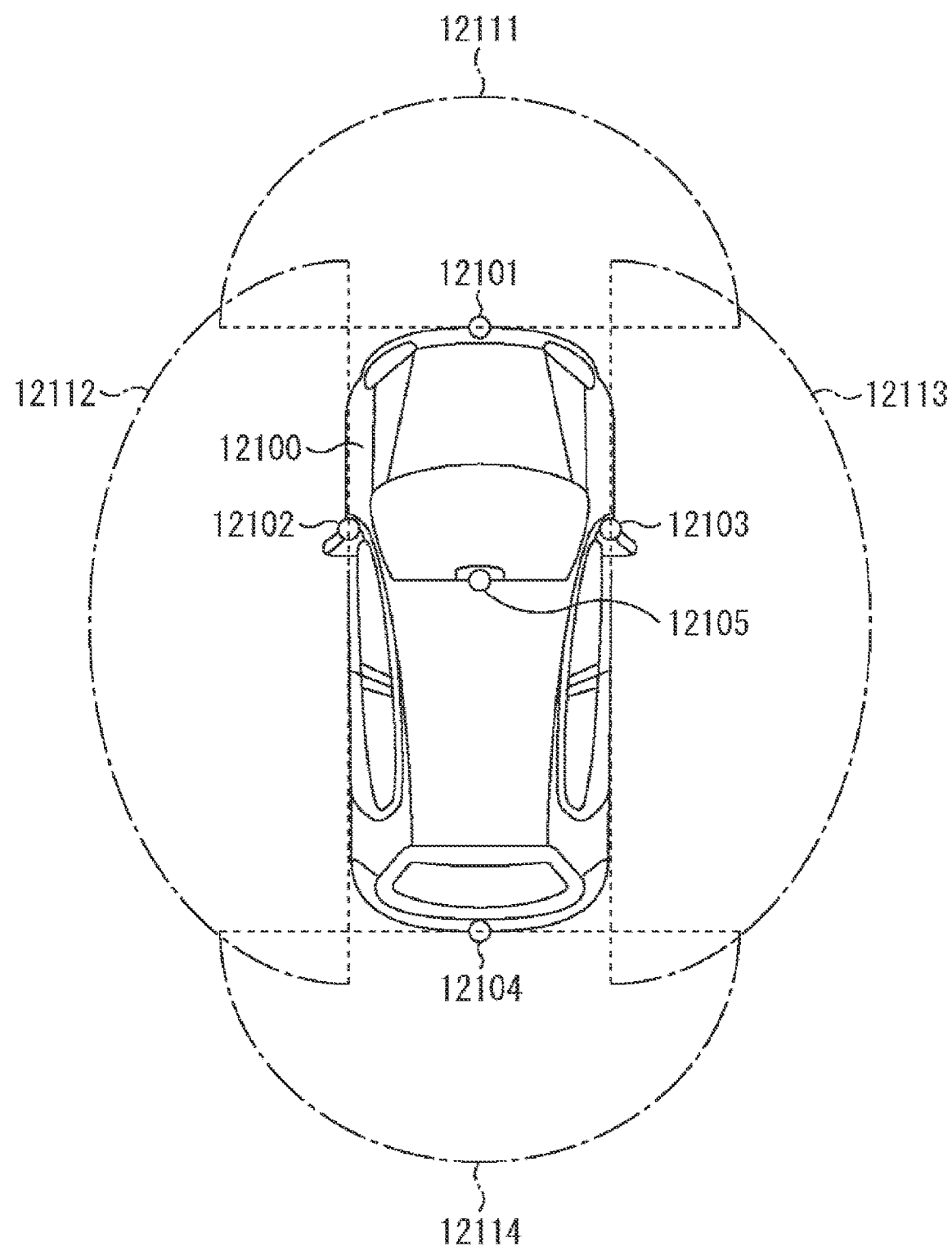
FIG. 31 is an explanatory diagram showing examples of mounting positions of a vehicle exterior information detector and image capture units.

FIG. 31 is a diagram showing examples of mounting positions of the image capture units 12031.

In FIG. 31, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100. The images of the front obtained by the image capture units 12101 and 12105 are mainly used for detecting a leading vehicle or detecting a pedestrian, an obstacle, a traffic light, a traffic sign, a lane, or the like.

Note that FIG. 31 shows examples of image capture ranges of the image capture units 12101 to 12104. The image capture range 12111 indicates the image capture range of the image capture unit 12101 on the front nose, the image capture ranges 12112 and 12113 indicate the image capture ranges of the image capture units 12102 and 12103 on the side-view mirrors, respectively, and the image capture range 12114 indicates the image capture range of the image capture unit 12104 on the rear bumper or the rear door. For example, by overlaying the image data captured by the image capture units 12101 to 12104 each other, a plane image of the vehicle 12100 as viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each three-dimensional (3D) object in the image capture ranges 12111 to 12114 and the temporal change (relative speed to the vehicle 12100) of the distance on the basis of the distance information obtained from the image capture units 12101 to 12104, the microcomputer 12051 may extract, as a leading vehicle, a 3D object which is especially the closest 3D object driving on the track on which the vehicle 12100 is driving at a predetermined speed (e.g., 0 km/h or more) in the direction substantially the same as the driving direction of the vehicle 12100. Further, by presetting a distance between the vehicle 12100 and a leading vehicle to be secured, the microcomputer 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcomputer 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is a preset value or more and when there is a possibility of a collision occurrence, the microcomputer 12051 may perform driving assistance to avoid a collision, in which the microcomputer 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcomputer 12051 may recognize a pedestrian by determining whether or not images captured by the image capture units 12101 to 12104 include the pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object, to thereby determine whether or not the object is a pedestrian. Where the microcomputer 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technology according to the present disclosure may be applied. The technology according to the present disclosure may be applied to the image capture unit 12031 or the like of the above-mentioned configurations.

It should be noted that embodiments of the present technology are not limited to the above-mentioned embodiments but various modifications can be made without departing from the gist of the present technology.

The present technology can also take the following configurations.

(1)

A solid-state imaging apparatus, including:
- an N-type region formed for each pixel and configured to perform photoelectric conversion;
- an inter-pixel light-shielding wall penetrating a semiconductor substrate in a depth direction and formed between N-type regions configured to perform the photoelectric conversion, the N-type regions each being formed for each of pixels adjacent to each other;
- a P-type layer formed between the N-type region configured to perform the photoelectric conversion and the inter-pixel light-shielding wall; and
- a P-type region adjacent to the P-type layer and formed between the N-type region and an interface on a side of a light incident surface of the semiconductor substrate.

(2)

The solid-state imaging apparatus according to (1), in which
the P-type layer is formed by doping with impurities from an inner wall of a groove opened in forming the inter-pixel light-shielding wall.

(3)

The solid-state imaging apparatus according to (1) or (2), in which
the P-type layer is formed, self-aligned with a shape of the inter-pixel light-shielding wall.

(4)

The solid-state imaging apparatus according to any of (1) to (3), in which
the P-type layer is a P-type solid-phase diffusion layer.

(5)

The solid-state imaging apparatus according to (4), in which
the N-type region includes a photoelectric converter and an N-type solid-phase diffusion layer, and
the N-type solid-phase diffusion layer is formed between the photoelectric converter and the P-type solid-phase diffusion layer.

(6)

The solid-state imaging apparatus according to any of (1) to (5), in which
the inter-pixel light-shielding wall is formed in an active region.

(7)

The solid-state imaging apparatus according to any of (1) to (5), in which
the inter-pixel light-shielding wall is formed in a shallow trench isolation.

(8)

The solid-state imaging apparatus according to any of (1) to (5), in which
the inter-pixel light-shielding wall is formed between a shallow trench isolation and an interface on the light incident surface side of the semiconductor substrate.

(9)

The solid-state imaging apparatus according to any of (1) to (8), in which
the inter-pixel light-shielding wall includes an inner wall on which a film having negative fixed electric charge is formed.

(10)

The solid-state imaging apparatus according to (5), in which
at least one of the P-type solid-phase diffusion layer and the N-type solid-phase diffusion layer has a concentration gradient of doping impurities in the depth direction of the semiconductor substrate.

(11)

The solid-state imaging apparatus according to any of (1) to (10), further including:
- a retainer configured to retain electric charge generated by the photoelectric converter; and
- a capacity-extending portion configured to extend the capacity of the retainer.

(12)

The solid-state imaging apparatus according to any of (1) to (11), in which
the inter-pixel light-shielding wall includes a $SiO_2$ film.

(13)

The solid-state imaging apparatus according to any of (1) to (12), further including:
- an electrode pad formed in a surface of the semiconductor substrate;
- a trench formed surrounding the electrode pad and extending through the semiconductor substrate in the depth direction of the semiconductor substrate;
- a P-type layer provided adjacent to the trench;
- an N-type layer provided adjacent to the P-type layer provided adjacent to the trench;
- a second P-type region adjacent to the P-type layer provided adjacent to the trench and formed between the N-type layer and the interface on the side of the light incident surface of the semiconductor substrate; and
- an electrode pad formed in a surface of the semiconductor substrate and surrounded with the trench.

(14)

The solid-state imaging apparatus according to any of (1) to (13), further including:
- a peripheral circuit portion in which a predetermined signal processing circuit is formed;
- a trench formed at a boundary between the peripheral circuit portion and a pixel array in which a plurality of pixels are arranged and extending through the semiconductor substrate in the depth direction of the semiconductor substrate;
- a P-type layer provided adjacent to the trench;
- an N-type layer provided adjacent to the P-type layer provided adjacent to the trench; and
- a second P-type region adjacent to the P-type layer provided adjacent to the trench and formed between the N-type layer and the interface on the side of the light incident surface of the semiconductor substrate.

(15)

The solid-state imaging apparatus according to any of (1) to (14), further including
a vertical-type transistor formed in the depth direction of the semiconductor substrate to reach the N-type region configured to perform the photoelectric conversion.

(16)

The solid-state imaging apparatus according to any of (1) to (15), further including
a well contact portion formed in an active region of each pixel region; and two or more contacts provided in the well contact portion.

(17)

The solid-state imaging apparatus according to (5), further including
a PN-junction portion formed within the photoelectric converter by ion implantation.

(18)

The solid-state imaging apparatus according to any of (1) to (17), in which each pixel region of the semiconductor substrate is surrounded with metal material, excluding the light incident surface.

(19)

The solid-state imaging apparatus according to any of (1) to (18), in which
a pixel transistor formed in the semiconductor substrate is shared with a plurality of pixels.

(20)

An electronic apparatus that is equipped with a solid-state imaging apparatus including
an N-type region formed for each pixel and configured to perform photoelectric conversion,
an inter-pixel light-shielding wall penetrating a semiconductor substrate in a depth direction and formed between N-type regions configured to perform the photoelectric conversion, the N-type regions each being formed for each of pixels adjacent to each other,
a P-type layer formed between the N-type region configured to perform the photoelectric conversion and the inter-pixel light-shielding wall, and
a P-type region adjacent to the P-type layer and formed between the N-type region and an interface on a side of a light incident surface of the semiconductor substrate.

(21)

An imaging device comprising:
a substrate;
a plurality of photoelectric conversion elements in the substrate, wherein each of the plurality of photoelectric conversion elements includes an N-type region that performs photoelectric conversion;
a light shielding wall between a first photoelectric conversion element and a second photoelectric conversion element of the plurality of photoelectric conversion elements in the substrate;
a first P-type region between the first photoelectric conversion region and the light shielding wall; and
a second P-type region adjacent to the first P-type region and between the first photoelectric conversion region and a light incident side interface of the substrate.

(22)

The imaging device according to (21), wherein the first P-type region is formed by doping with impurities from an inner wall of a groove of the light-shielding wall.

(23)

The imaging device according to (22), wherein the first P-type region is self-aligned with a shape of the inter-pixel light-shielding wall.

(24)

The imaging device according to (21), wherein the first P-type region is a P-type solid-phase diffusion layer.

(25)

The imaging device according to (24), wherein
the N-type region of the first photoelectric conversion element includes an N-type solid-phase diffusion layer, and
the N-type solid-phase diffusion layer is formed between the first photoelectric conversion element and the P-type solid-phase diffusion layer.

(26)

The imaging device according to any of (21) to (25), wherein
the light-shielding wall is in an active region.

(27)

The imaging device according to any of (21) to (26), wherein the light-shielding wall is formed in a shallow trench isolation.

(28)

The imaging device according to (21), wherein
the light-shielding wall is between a shallow trench isolation and the light incident side interface of the substrate.

(29)

The imaging device according to (21), wherein
the light-shielding wall includes an inner wall having a film with a negative fixed electric charge.

(30)

The imaging device according to (25), wherein
at least one of the P-type solid-phase diffusion layer and the N-type solid-phase diffusion layer has a concentration gradient of doping impurities in a depth direction of the semiconductor substrate.

(31)

The imaging device according to (25), further comprising:
a retainer configured to retain electric charge generated by the photoelectric conversion elements; and
a capacity-extending portion configured to extend the capacity of the retainer.

(32)

The imaging device according to (21), wherein
the light-shielding wall includes an SiO2 film.

(33)

The imaging device according to any of (21) to (32), further comprising:
an electrode pad formed on a surface of the semiconductor substrate;
a trench formed surrounding the electrode pad and extending through the semiconductor substrate in a depth direction of the semiconductor substrate.

(34)

The imaging device according to any of (21) to (33), further comprising:
a peripheral circuit portion, wherein the peripheral circuit portion includes a predetermined signal processing circuit;
a trench at a boundary between the peripheral circuit portion and a pixel array in which a plurality of pixels are arranged and extending through the semiconductor substrate in a depth direction of the semiconductor substrate,
a third P-type region adjacent to the trench;
a second N-type region adjacent to the third P-type region provided adjacent to the trench; and
a fourth P-type region adjacent to the third P-type region adjacent to the trench and formed between the second N-type region and the light incident side of the substrate.

(35)

The imaging device according to (21), further comprising
a vertical-type transistor formed in a depth direction of the substrate to reach the N-type region that performs photoelectric conversion.

(36)

The imaging device according to (22), further comprising
a well contact portion formed in an active region of each pixel region; and
two or more contacts provided in the well contact portion.

(37)

The imaging device according to (25), further comprising
a PN-junction portion formed within the first photoelectric conversion element by ion implantation.

(38)
The imaging device according to any of (21) to (37), wherein
each pixel region of the substrate is surrounded with metal material, excluding the light incident side.
(39)
The imaging device according to any of (21) to (38), wherein
a pixel transistor formed in the substrate is shared with a plurality of pixels.
(40)
An electronic apparatus comprising:
an imaging device, including:
a substrate;
a plurality of photoelectric conversion elements in the substrate, wherein each of the plurality of photoelectric conversion elements includes an N-type region that performs photoelectric conversion;
a light shielding wall between a first photoelectric conversion element and a second photoelectric conversion element of the plurality of photoelectric conversion elements in the substrate;
a first P-type region between the first photoelectric conversion region and the light shielding wall; and
a second P-type region adjacent to the first P-type region and between the first photoelectric conversion region and a light incident side interface of the substrate.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 Si substrate
11 PD
12 DTI
13 P-type solid-phase diffusion layer
14 N-type solid-phase diffusion layer
15 Light-shielding film
16 OCL
17 Vertical-type transistor trench
19 Active region
20 Backside Si interface
21 STI
31 Sidewall film
32 Filler
35 P-type region
61 Film
71 MOS capacitor
101 Al-pad extraction portion
102 Al pad
103 Solid-phase diffusion trench
111 Peripheral circuit portion
112 P+ diffusion layer
113 Pwell region
114 Backside contact
121 Peripheral circuit portion
122 Pwell region
151 Well contact portion
152 Contact
153 Cu wire
161 Peripheral circuit portion
162 Boundary portion
171 P-type region
172 N-type region
191 FD wire
192 Conversion efficiency-switching transistor
193 MOS capacitor

The invention claimed is:

1. An imaging device, comprising:
a substrate;
a plurality of photoelectric conversion elements in the substrate, wherein each of the plurality of photoelectric conversion elements includes an N-type region that performs photoelectric conversion;
a light-shielding wall between a first photoelectric conversion element and a second photoelectric conversion element of the plurality of photoelectric conversion elements in the substrate in a cross-sectional view;
a first P-type region between the first photoelectric conversion element and the light-shielding wall in the cross-sectional view;
a second P-type region adjacent to the first P-type region and between the first photoelectric conversion element and a light incident side of the substrate in the cross-sectional view; and
a vertical-type transistor extending in a depth direction of the substrate in the cross-sectional view, wherein a gate of the vertical-type transistor includes two trench-type electrodes.

2. The imaging device according to claim 1, wherein the first P-type region is formed by doping with impurities from an inner wall of a groove of the light-shielding wall.

3. The imaging device according to claim 2, wherein the first P-type region is self-aligned with a shape of the light-shielding wall.

4. The imaging device according to claim 1, wherein the first P-type region is a P-type solid-phase diffusion layer.

5. The imaging device according to claim 4, wherein the N-type region of the first photoelectric conversion element includes an N-type solid-phase diffusion layer, and wherein the N-type solid-phase diffusion layer is formed between the first photoelectric conversion element and the P-type solid-phase diffusion layer.

6. The imaging device according to claim 2, wherein the light-shielding wall is in an active region.

7. An electronic apparatus, comprising:
an image processor; and
an imaging device, comprising:
a substrate;
a plurality of photoelectric conversion elements in the substrate, wherein each of the plurality of photoelectric conversion elements includes an N-type region that performs photoelectric conversion;
a light-shielding wall between a first photoelectric conversion element and a second photoelectric conversion element of the plurality of photoelectric conversion elements in the substrate in a cross-sectional view;
a first P-type region between the first photoelectric conversion element and the light-shielding wall in the cross-sectional view;
a second P-type region adjacent to the first P-type region and between the first photoelectric conversion element and a light incident side of the substrate in the cross-sectional view; and
a vertical-type transistor extending in a depth direction of the substrate in the cross-sectional view, wherein a gate of the vertical-type transistor includes two trench-type electrodes.

8. The electronic apparatus according to claim 7, wherein the first P-type region is formed by doping with impurities from an inner wall of a groove of the light-shielding wall.

9. The electronic apparatus according to claim 8, wherein the first P-type region is self-aligned with a shape of the light-shielding wall.

10. The electronic apparatus according to claim 7, wherein the first P-type region is a P-type solid-phase diffusion layer.

11. The electronic apparatus according to claim 10, wherein the N-type region of the first photoelectric conversion element includes an N-type solid-phase diffusion layer, and wherein the N-type solid-phase diffusion layer is formed between the first photoelectric conversion element and the P-type solid-phase diffusion layer.

12. The electronic apparatus according to claim 8, wherein the light-shielding wall is in an active region.

* * * * *